(12) United States Patent
Ji et al.

(10) Patent No.: US 9,281,310 B2
(45) Date of Patent: Mar. 8, 2016

(54) SEMICONDUCTOR DEVICE INCLUDING GATE STRUCTURE FOR THRESHOLD VOLTAGE MODULATION IN TRANSISTORS AND METHOD FOR FABRICATING THE SAME

(71) Applicant: SK hynix Inc., Gyeonggi-do (KR)

(72) Inventors: Yun-Hyuck Ji, Gyeonggi-do (KR); Se-Aug Jang, Gyeonggi-do (KR); Seung-Mi Lee, Gyeonggi-do (KR); Hyung-Chul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/213,571

(22) Filed: Mar. 14, 2014

(65) Prior Publication Data

US 2015/0129973 A1 May 14, 2015

(30) Foreign Application Priority Data

Nov. 12, 2013 (KR) .......................... 10-2013-0136842

(51) Int. Cl.
*H01L 27/092* (2006.01)
*H01L 21/8238* (2006.01)
*H01L 29/51* (2006.01)

(52) U.S. Cl.
CPC .... *H01L 27/0922* (2013.01); *H01L 21/823842* (2013.01); *H01L 21/823857* (2013.01); *H01L 29/512* (2013.01)

(58) Field of Classification Search
CPC ................ H01L 29/517; H01L 29/513; H01L 21/823842; H01L 29/4966; H01L 21/823857
See application file for complete search history.

(56) References Cited

U.S. PATENT DOCUMENTS

| 8,212,322 | B2 | 7/2012 | Frank et al. | |
| 2004/0023478 | A1* | 2/2004 | Samavedam et al. | ......... 438/592 |
| 2009/0152636 | A1 | 6/2009 | Chudzik et al. | |
| 2010/0038721 | A1 | 2/2010 | Lin et al. | |
| 2012/0025321 | A1* | 2/2012 | Manabe | ........................ 257/369 |

* cited by examiner

*Primary Examiner* — Tony Tran
(74) *Attorney, Agent, or Firm* — IP & T Group LLP

(57) ABSTRACT

A method for fabricating a semiconductor device includes forming an NMOS region and a PMOS region in a substrate, forming a first stack layer including a first gate dielectric layer and a first work function layer that is disposed over the first gate dielectric layer and contains aluminum, over the PMOS region of the substrate, forming a second stack layer including a second gate dielectric layer, a threshold voltage modulation layer that is disposed over the second gate dielectric layer and contains lanthanum, and a second work function layer that is disposed over the threshold voltage modulation layer, over the NMOS region of the substrate, and annealing the first stack layer and the second stack layer, thereby forming a first dipole-interface by diffusion of the aluminum in the first gate dielectric layer and a second dipole-interface by diffusion of the lanthanum in the second gate dielectric layer, respectively.

16 Claims, 18 Drawing Sheets

SEMICONDUCTOR DEVICE INCLUDING GATE STRUCTURE FOR THRESHOLD VOLTAGE MODULATION IN TRANSISTORS AND METHOD FOR FABRICATING THE SAME

CROSS-REFERENCE TO RELATED APPLICATIONS

The present application claims priority of Korean Patent Application No. 10-2013-0136842, filed on Nov. 12, 2013, which is incorporated herein by reference in its entirety.

BACKGROUND

1. Field

Exemplary embodiments of the present invention relate to a semiconductor device, more particularly, to a semiconductor device including a gate structure for threshold voltage modulation in transistors, and a method for fabricating the same.

2. Description of the Related Art

If a transistor is scaled down to improve the performance thereof, gate leakage increases as the thickness of a gate dielectric layer becomes thin. In order to cope with this concern, the material of a gate dielectric layer is replaced with a high-k material that has a dielectric constant larger than the dielectric constant of $SiO_2$. The high-k material may include a metal oxide containing hafnium, a metal oxide containing zirconium or the like. However, the introduction of the high-k material may have resulted in a Fermi level pinning effect. This effect is caused due to contact between the gate dielectric layer of the high-k material and a polysilicon gate electrode. Fermi level pinning is a basic characteristic of an interface between a polysilicon gate electrode and a metal oxide layer, and tends to increase the threshold voltage of a transistor.

Recently, in order to overcome the Fermi level pinning, a gate stack including a high-k material layer and a metal gate electrode has been suggested. However, it may be difficult to form metal gate electrodes with an N type work function and a P type work function, which require threshold voltages (Vt) appropriate for respective transistors, in a fabrication process of a CMOS device. Also, even when metal gate electrodes with work functions appropriate for respective transistors are formed, the effective work functions of gate stacks may be changed due to various factors that are raised in terms of the material of a gate dielectric layer a gate stack forming process (for example, an etching process and a thermal process at a high temperature), and so forth.

SUMMARY

Various embodiments are directed to a semiconductor device including a gate structure for threshold voltage modulation in transistors, which may independently modulate the threshold voltages of an N channel transistor and a P channel transistor, and a method for fabricating the same.

In an exemplary embodiment of the present invention, a method for fabricating a semiconductor device may include forming an NMOS region and a PMOS region in a substrate, forming a first stack layer including a first gate dielectric layer and a first work function layer that is disposed over the first gate dielectric layer and contains aluminum, over the PMOS region of the substrate, forming a second stack layer including a second gate dielectric layer, a threshold voltage modulation layer which is disposed over the second gate dielectric layer and contains lanthanum and a second work function layer that is disposed over the threshold voltage modulation layer, over the NMOS region of the substrate, and annealing the first stack layer and the second stack layer, thereby forming a first dipole-interface by diffusion of the aluminum in the first gate dielectric layer and a second dipole-interface by diffusion of the lanthanum in the second gate dielectric layer, respectively.

In another exemplary embodiment of the present invention, a method for fabricating a semiconductor device may include forming a PMOS region and an NMOS region in a substrate, forming a gate dielectric layer over the substrate, stacking a first titanium nitride layer that contains aluminum, and a silicon layer, over the gate dielectric layer, selectively removing the silicon layer and the first titanium nitride from the NMOS region, stacking a threshold voltage modulation layer that contains lanthanum, and a second titanium nitride layer, over the remaining silicon layer of the PMOS region and the gate dielectric layer of the NMOS region, and annealing a resulting structure on the substrate, thereby diffusing the aluminum into the gate dielectric layer of the PMOS region and the lanthanum into the gate dielectric layer of the NMOS region, respectively.

In still another exemplary embodiment of the present invention, a semiconductor device may include an N channel transistor and a P channel transistor, wherein the P channel transistor includes a first metal gate electrode that includes a first titanium nitride layer containing aluminum, a first gate dielectric layer that is disposed under the first metal gate electrode and has a first dipole-interface by diffusion of the aluminum, and a germanium-containing channel region under the first gate dielectric layer, and wherein the N channel transistor includes a second metal gate electrode that includes a second titanium nitride layer of a thickness thinner than that of the first titanium nitride layer, a threshold voltage modulation layer that is disposed under the second metal gate electrode layer and contains a lanthanum series element, and a second gate dielectric layer that is disposed under the threshold voltage modulation layer and has a second dipole-interface by diffusion of the lanthanum series element.

According to the embodiments, since a dipole-interface and a P type work function gate electrode are included, it may be possible to decrease the threshold voltage of a P channel transistor.

Also according to the embodiments since a dipole interface and a thin N type work function gate electrode are included, it may be possible to decrease the threshold voltage of an N channel transistor.

Moreover, according to the embodiments, since a reaction preventing layer is formed on a P type work function gate electrode, it may be possible to substantially prevent the effective work function of a gate stack from being decreased from a subsequent process. In addition, because the reaction preventing layer is formed, and it is not necessary to remove a non-threshold voltage modulation layer and a non-work function layer, which are formed on the reaction preventing layer, a process may be simplified.

As a result, according to the embodiments, the threshold voltages of an N channel transistor and a P channel transistor may be independently modulated in an integration process of a CMOSFET.

DETAILED DESCRIPTION

Figure 1A:
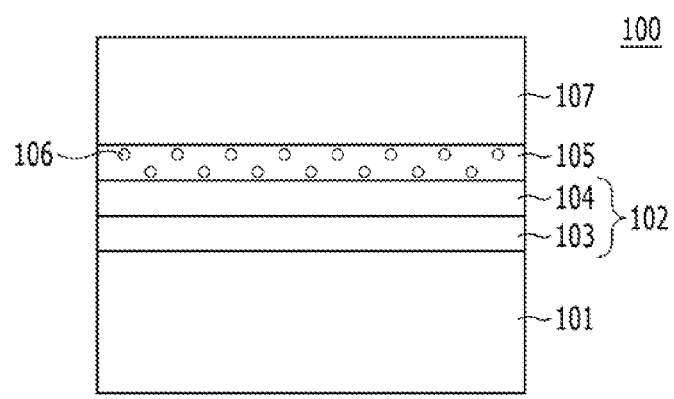
FIGS. 1A and 1B are views explaining a method for threshold voltage modulation of a transistor in accordance with a first embodiment.

Various examples and implementations of the disclosed technology are described below in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate. It is also noted that in this specification, "coupled" refers to one component not only directly coupling another component but also indirectly coupling another component through an intermediate component. In addition, a singular form may include a plural form as long as it is not specifically mentioned in a sentence.

Figure 1B:
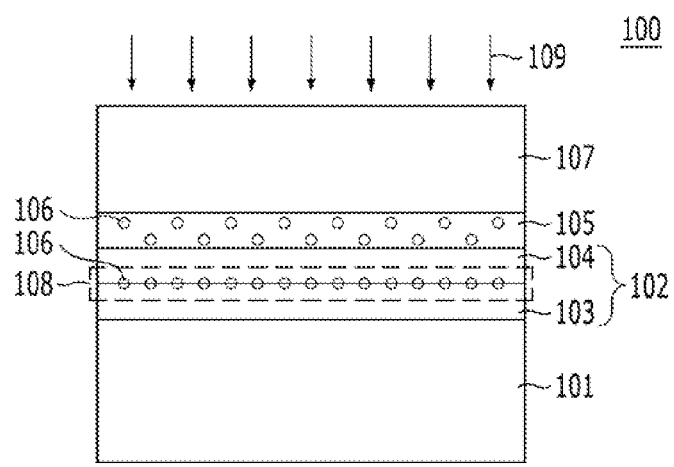

FIGS. 1A and 1B are views explaining a method for threshold voltage modulation of a transistor in accordance with a first embodiment.

As shown in FIG. 1A, in order to form a transistor 100, a substrate 101 is prepared. The substrate 101 may include a silicon substrate.

A gate dielectric layer 102 is formed on the substrate 101. The gate dielectric layer 102 includes an interface layer 103 and a high-k dielectric layer 104.

A threshold voltage (Vt) modulation layer 105 is formed. The threshold voltage modulation layer 105 is a layer that contains a species 106 for modulating the threshold voltage of the transistor 100. The species 106 may include a lanthanum series element. The threshold voltage modulation layer 105 may include lanthanum oxide.

A gate electrode 107 is formed. The gate electrode 107 has an effective work function appropriate for the transistor 100. The gate electrode 107 includes a metal nitride. The gate electrode 107 includes titanium nitride.

As shown in FIG. 1B a dipole-interface 108 is formed in the gate dielectric layer 102. The dipole-interface 108 is formed by an annealing process 109. By the annealing process 109, the species 106 diffuses to the interface between the interface layer 103 and the high-k dielectric layer 104. The dipole interface 108 is formed on the interface between the interface layer 103 and the high-k dielectric layer 104. The annealing process 109 may include annealing for activating a source and a drain. Also, the annealing process 109 may include an annealing process after forming the gate electrode 107.

As the dipole-interface 108 is formed, the threshold voltage of the transistor 100 is modulated. In particular, by the dipole-interface 108 including a lanthanum series element, the threshold voltage of the transistor 100 is shifted in a negative direction.

Figure 2A:
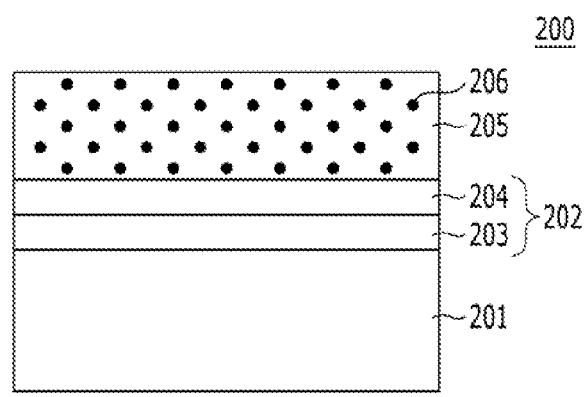
FIGS. 2A and 2B are views explaining a method for threshold voltage modulation of a transistor in accordance with a second embodiment.
Figure 2B:
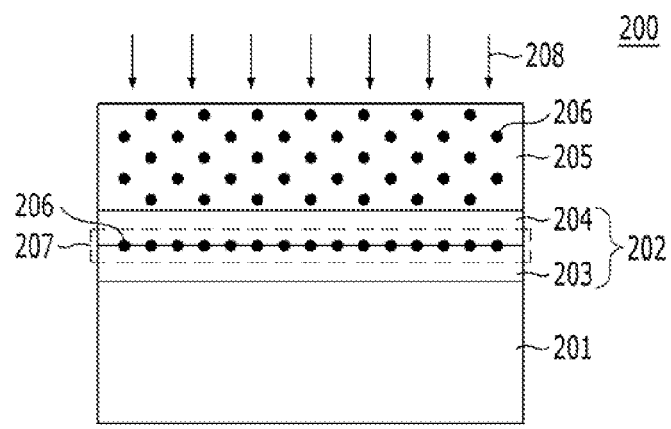

FIGS. 2A and 2B are views explaining a method for threshold voltage modulation of a transistor in accordance with a second embodiment.

Referring to FIG. 2A, in order to form a transistor 200, a substrate 201 is prepared. The substrate 201 may include a silicon substrate.

A gate dielectric layer 202 is formed on the substrate 201. The gate dielectric layer 202 includes an interface layer 203 and a high-k dielectric layer 204.

A gate electrode 205 is formed on the gate dielectric layer 202. The gate electrode 205 has an effective work function appropriate for the transistor 200. The gate electrode 205 includes a species 206 for modulating the threshold voltage of the transistor 200. The species 206 may be doped into the gate electrode 205. The species 206 includes aluminum. The gate electrode 205 may include a titanium nitride layer that contains aluminum.

As shown in FIG. 2B, a dipole-interface 207 is formed in the gate dielectric layer 202. The dipole-interface 207 is formed by an annealing process 208. By the annealing process 208, the species 206 diffuses to the interface between the interface layer 203 and the high-k dielectric layer 204. The dipole-interface 207 is formed on the interface between the interface layer 203 and the high-k dielectric layer 204. The annealing process 208 may include annealing for activating a source and a drain. Also, the annealing process 208 may include an annealing process after forming the gate electrode 205.

As the dipole-interface 207 is formed, the threshold voltage of the transistor 200 is modulated. In particular, by the dipole-interface 207 including aluminum, the threshold voltage of the transistor 200 is shifted in a positive direction.

Figure 3:
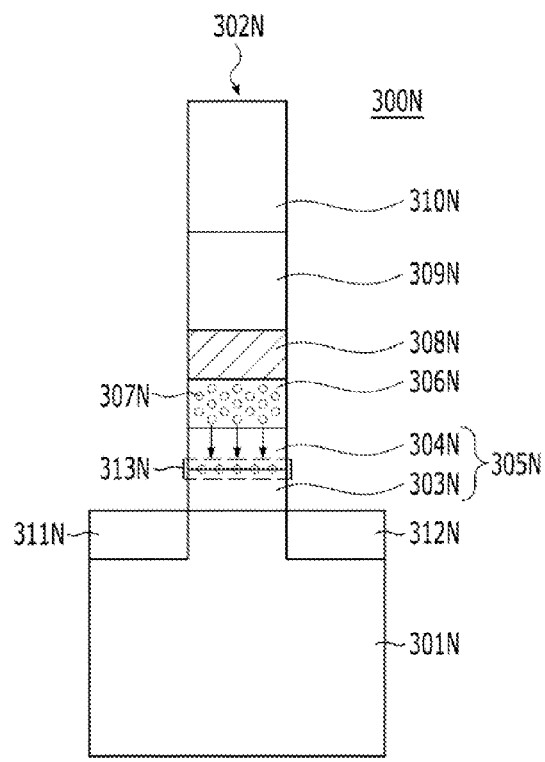
FIG. 3 is a view illustrating a transistor to which the first embodiment is applied.

FIG. 3 is a view illustrating an N transistor to which the first embodiment is applied.

Referring to FIG. 3, an N channel transistor 300N includes a gate stack 302N, a source region 311N and a drain region 312N. The N channel transistor 300N includes an NMOSFET.

The gate stack 302N is formed on a substrate 301N. The gate stack 302N includes a gate dielectric layer 305N, a threshold voltage modulation layer 306N, and a gate electrode 308N. The gate dielectric layer 305N includes an interface layer 303N and a high-k dielectric layer 304N. The threshold voltage modulation layer 306N is formed between the high-k dielectric layer 304N and the gate electrode 308N. A capping layer 309N is formed on the gate electrode 308N. A low resistance layer 310N is formed on the capping layer 309N.

The interface layer 303N may include a silicon oxide, a silicon oxynitride, and so forth. For example, the interface layer 303N may include $SiO_2$ or SiON.

The high-k dielectric layer 304N has a material with a high dielectric constant (high-k). The material with a high dielectric constant of the high-k dielectric layer 304N has a dielectric constant larger than the dielectric constant (approximately 3.9) of $SiO_2$. The high-k dielectric layer 304N is physically substantially thicker than a layer having $SiO_2$, and has an equivalent oxide thickness (EOT) value smaller than that of a layer having $SiO_2$. Thus, the high-k dielectric layer 304N may have a dielectric constant larger than that of the interface layer 303N having, e.g., $SiO_2$. The high-k dielectric layer 304N may include a metal oxide, a metal silicate, a metal silicate nitride, or the like. The metal oxide includes an oxide containing a metal such as hafnium (Hf), aluminum (Al), lanthanum (La) and zirconium (Zr). The metal oxide may include hafnium oxide, aluminum oxide, lanthanum oxide, zirconium oxide, or a combination thereof. For example, the metal oxide may include $HfO_2$, $Al_2O_3$, $La_2O_3$, $ZrO_2$, or a combination thereof. The metal silicate includes a silicate that includes a metal such as hafnium (Hf) and zirconium (Zr). For example, the metal silicate may include hafnium silicate (HfSiO), zirconium silicate (ZrSiO) or a combination thereof. The metal silicate nitride may include hafnium silicate nitride (HfSiON), zirconium silicate nitride (ZrSiON), or a combination thereof.

The threshold voltage modulation layer 306N includes a species 307N for modulating the threshold voltage of the N channel transistor 300N. A dipole-interface 313N is formed in the gate dielectric layer 305N by diffusion of the species 307N. The dipole-interface 313N is formed on the interface of the interface layer 303N and the high-k dielectric layer 304N. The threshold voltage of the N channel transistor 300N is modulated by the dipole-interface 313N. The species 307N may include a lanthanum series element. The threshold voltage modulation layer 306N may include lanthanum oxide.

The gate electrode 308N has a work function appropriate for the N channel transistor 300N. The gate electrode 308N includes a work function layer that has an N type work function. The gate electrode 308N includes an N type work function metal-containing layer. The thickness of the gate electrode 308N is thinly controlled to approximately 30 Å or under to have an N type work function. The gate electrode 308N includes titanium nitride. The titanium nitride has a stoichiometric composition ratio. That is to say, the composition ratio between titanium and nitrogen is approximately 1:1. The titanium nitride with the thin thickness and the stoichiometric composition ratio is a material with a low effective work function.

The capping layer 309N includes a polysilicon layer. The capping layer 309N protects the gate electrode 308N from a subsequent process.

The low resistance layer 310N includes a metal silicide. The low resistance layer 310N reduces the resistance of the gate stack 302N. The low resistance layer 310N includes a silicide layer that contains platinum and nickel.

The source region 311N and the drain region 312N include N type impurities.

In FIG. 3, the dipole-interface 313N is formed by an annealing process. For example, the dipole-interface 313N is formed by an annealing process for activating the source region 311N and the drain region 312N. Also, the dipole-interface 313N may be formed by an annealing process for forming the low resistance layer 310N.

In this way, as the dipole-interface 313N is formed by diffusion of the species 307N it may be possible to shift the threshold voltage of the N channel transistor 300N in a negative direction. Moreover, the threshold voltage may be further shifted by the gate electrode 308N with a thin thickness.

Figure 4:
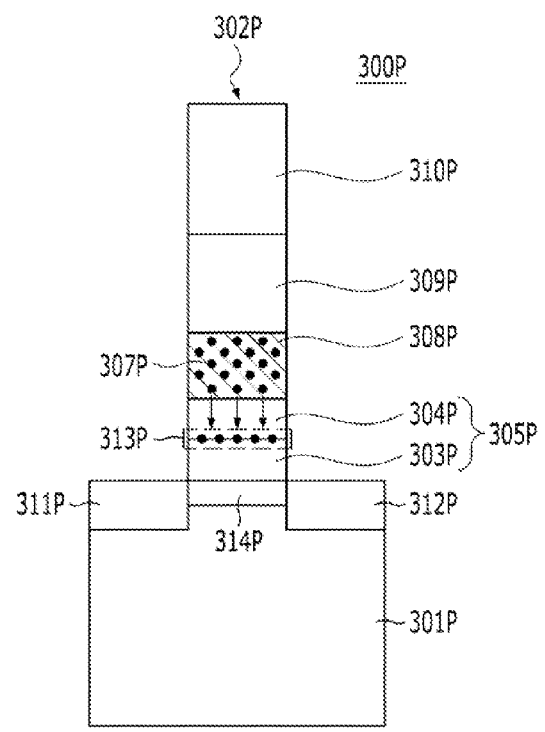
FIG. 4 is a view illustrating a transistor to which the second embodiment is applied.

FIG. 4 is a view illustrating a P channel transistor to which the second embodiment is applied.

Referring to FIG. 4, a P channel transistor 300P includes a gate stack 302P, a source region 311P and a drain region 312P. The P channel transistor 300P includes a PMOSFET.

The gate stack 302P is formed on a substrate 301P. The gate stack 302P includes a gate dielectric layer 305P, and a gate electrode 308P. The gate dielectric layer 305P includes an interface layer 303P and a high-k dielectric layer 304P. The gate electrode 308P includes a species 307P for threshold voltage modulation. A capping layer 309P is formed on the gate electrode 308P. A low resistance layer 310P is formed on the capping layer 309P.

The interface layer 303P may include silicon oxide, silicon oxynitride, and so forth. For example, the interface layer 303P may include $SiO_2$ or SiON.

The high-k dielectric layer 304P has a material with a high dielectric constant (high-k). The material with a high dielectric constant of the high-k dielectric layer 304P has a dielectric constant larger than the dielectric constant (approximately 3.9) of $SiO_2$. The high-k dielectric layer 304P is physically substantially thicker than a layer having $SiO_2$, and has an equivalent oxide thickness (EOT) value smaller than that of a layer having $SiO_2$. Thus, the high-k dielectric layer 304P may have a dielectric constant larger than that of the interface layer 303P having, e.g., $SiO_2$. The high-k dielectric layer 304P may include a metal oxide, a metal silicate, a metal silicate nitride, or the like. The metal oxide includes an oxide containing a metal such as hafnium (Hf), aluminum (Al), lanthanum (La) and zirconium (Zr). The metal oxide may include hafnium oxide, aluminum oxide, lanthanum oxide, zirconium oxide, or a combination thereof. For example, the metal oxide may include $HfO_2$, $Al_2O_3$, $La_2O_3$, $ZrO_2$, or a combination thereof. The metal silicate includes a silicate that includes a metal such as hafnium (Hf) and zirconium (Zr). For example, the metal silicate may include hafnium silicate (HfSiO), zirconium silicate (ZrSiO) or a combination thereof. The metal silicate nitride may include hafnium silicate nitride (HfSiON), zirconium silicate nitride (ZrSiON), or a combination thereof.

The gate electrode 308P includes a species 307P for modulating the threshold voltage of the P channel transistor 300P. A dipole-interface 313P is formed in the gate dielectric layer 305P by diffusion of the species 307P. The dipole-interface 313P is formed on the interface of the interface layer 303P and the high-k dielectric layer 304P. The threshold voltage of the P channel transistor 300P is modulated by the dipole-interface 313P. The species 307N may include aluminum.

The gate electrode 308P has a work function appropriate for the P channel transistor 300P. The gate electrode 308P includes a work function layer that has a P type work function. The gate electrode 308P includes a P type work function metal-containing layer.

The species 307P includes aluminum. The gate electrode 308P includes a titanium nitride layer that is doped with the species 307P. For example, the gate electrode 308P may include titanium aluminum nitride (TiAlN). The titanium aluminum nitride is a material that has a high effective work function. The gate electrode 308P containing aluminum has a thickness thicker than the gate electrode 308N shown in FIG. 3, and accordingly, has a P type work function.

The capping layer 309P includes a polysilicon layer. The capping layer 309P protects the gate electrode 308P from a subsequent process.

The low resistance layer 310P includes a metal silicide. The low resistance layer 310P reduces the resistance of the gate stack 302P. The low resistance layer 310P includes a silicide layer that contains platinum and nickel.

The source region 311P and the drain region 312P include P type impurities. A germanium-containing channel region 314P is formed between the source region 311P and the drain region 312P. The germanium-containing channel region 314P may include an epitaxial layer that includes germanium. The germanium-containing channel region 314P may include an SiGe/Si epitaxial layer in which a silicon germanium layer and a silicon cap layer are stacked.

In FIG. 4, the dipole-interface 313P is formed by an annealing process. For example, the dipole-interface 313P is formed by an annealing process for activating the source region 311P and the drain region 312P. Also, the dipole-interface 313P may be formed by an annealing process for forming the low resistance layer 310P.

In this way, by the dipole-interface 313P formed through diffusion of the species 307P from the gate electrode 308P, it may be possible to modulate the threshold voltage of the P channel transistor 300P. Moreover, since the germanium-containing channel region 314P includes the SiGe/Si epitaxial layer, threshold voltage modulation becomes easier. By introducing the germanium-containing channel region 314P, an energy band gap may be decreased to approximately 0.66 eV when compared to approximately 1.12 eV of silicon.

Figure 5:
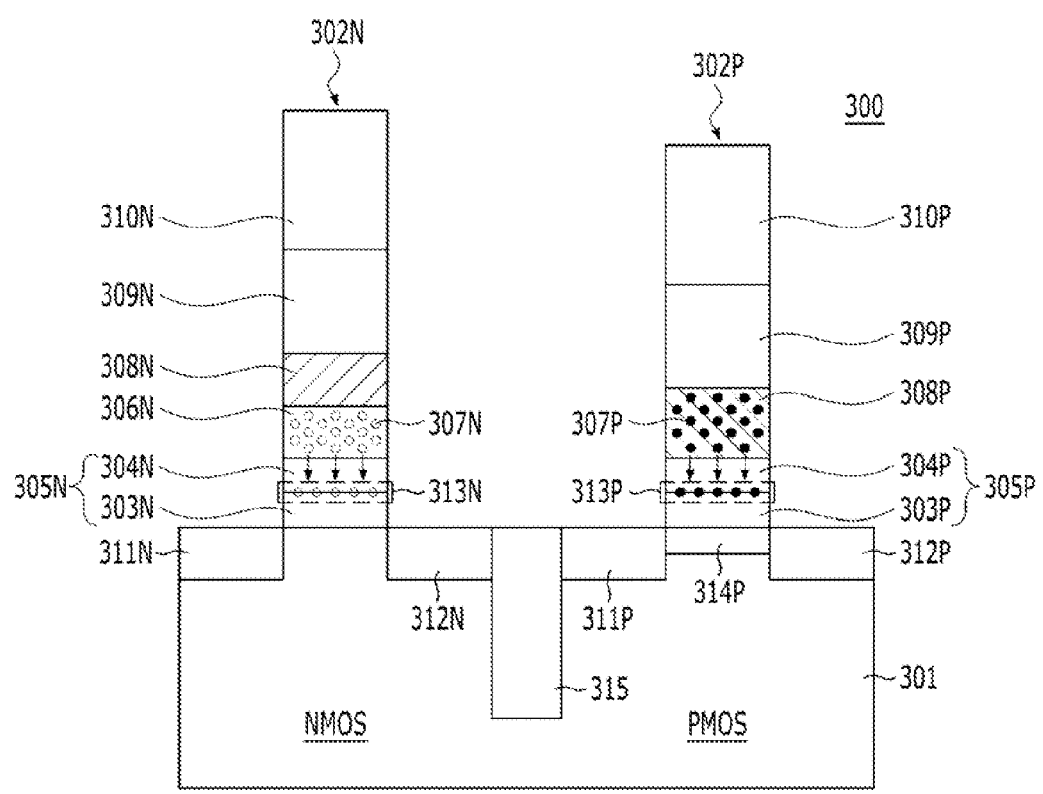
FIG. 5 is a view illustrating an exemplary CMOSFET to which the first embodiment and the second embodiment are applied.

FIG. 5 is a view illustrating an exemplary CMOSFET to which the first embodiment and the second embodiment are applied. FIG. 5 shows a CMOSFET in which the N channel transistor 300N of FIG. 3 and the P channel transistor 300P of FIG. 4 are integrated.

Referring to FIG. 5, a CMOSFET 300 includes an N channel transistor NMOS and a P channel transistor PMOS. A substrate 301 may include a silicon substrate, a silicon-germanium substrate, or an SOI (silicon-on-insulator) substrate. The N channel transistor NMOS and the P channel transistor PMOS are isolated by an isolation region 315. For the N channel transistor NMOS, reference will be made to the transistor 300N shown in FIG. 3. For the P channel transistor PMOS, reference will be made to the transistor 300P shown in FIG. 4.

The N channel transistor NMOS includes a gate stack 302N. The gate stack 302N includes a gate dielectric layer 305N, a threshold voltage modulation layer 306N, a gate electrode 308N, a capping layer 309N, and a low resistance layer 310N. The gate dielectric layer 305N includes an interface layer 303N and a high-k dielectric layer 304N. The threshold voltage modulation layer 306N is formed between the high-k dielectric layer 304N and the gate electrode 308N. A dipole-interface 313N is formed on the interface of the interface layer 303N and the high-k dielectric layer 304N. The threshold voltage modulation layer 306N contains a species 307N including lanthanum.

The P channel transistor PMOS includes a germanium-containing channel region 314P and a gate stack 302P. The gate stack 302P includes a gate dielectric layer 305P and a gate electrode 308P. The gate dielectric layer 305P includes an interface layer 303P and a high-k dielectric layer 304P. The gate electrode 308P includes a species 307P including aluminum for threshold voltage modulation. A capping layer 309P is formed on the gate electrode 308P. A low resistance layer 310P is formed on the capping layer 309P. A dipole-interface 313P is formed on the interface of the interface layer 303P and the high-k dielectric layer 304P.

In order to achieve a threshold voltage (Vt) for the operation of a CMOSFET, a metal gate electrode with an appropriate effective word function (EWF) may be needed. For example, the effective work functions of the gate electrode of an NMOS and the gate electrode of a PMOS may be approximately 4.1 eV and approximately 5.1 eV, respectively. Such work function values are referred to as band-edge work functions because of respective proximities to the conduction and valence band edges of silicon.

In the CMOSFET 300 according to the present embodiment, the gate electrode 308N of the NMOS includes a thin titanium nitride layer with a low effective work function. By this fact, approximately 4.1 eV as the band-edge work function of the NMOS may be achieved. Further, since the thin titanium nitride layer has a composition ratio of approximately 1:1 between titanium and nitrogen and is not a metal-rich titanium nitride, thermal stability is remarkably high. In the titanium nitride layer having the composition ratio of approximately 1:1 between titanium and nitrogen, if a thickness decreases an effective work function decreases. In this way, as a titanium nitride layer that has the composition ratio of approximately 1:1 between titanium and nitrogen and a thickness of approximately 20 Å to approximately 30 Å is introduced, the threshold voltage of the NMOS is shifted by approximately −200 mV. Moreover, due to the presence of the threshold voltage modulation layer 306N, the threshold voltage is further shifted in a negative direction.

In the CMOSFET 300 according to the present embodiment, as the germanium-containing channel region 314P is introduced for threshold voltage modulation of the PMOS, an energy band gap may be decreased to approximately 0.66 eV. Also, the gate electrode 308P of the PMOS includes a titanium aluminum nitride with a high effective work function. By this fact, approximately 5.1 eV as the band-edge work function of the PMOS may be achieved.

In this way, in the CMOSFET 300, the threshold voltage of the N channel transistor NMOS is modulated by the dipole-interface 313N and the gate electrode 308N. The threshold voltage of the P channel transistor PMOS is modulated by the dipole-interface 313P, the gate electrode 308P and the germanium-containing channel region 314P.

Figure 6:
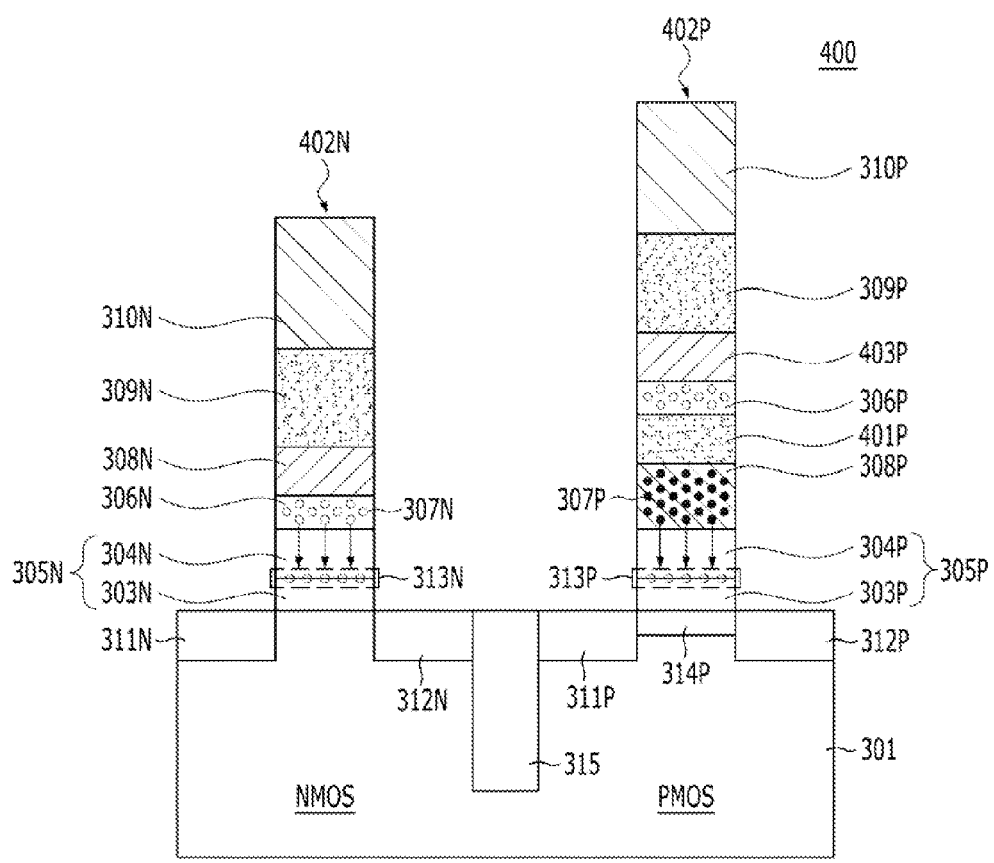
FIG. 6 is a view illustrating another exemplary CMOSFET to which the first embodiment and the second embodiment are applied.

FIG. 6 is a view illustrating another exemplary CMOSFET to which the first embodiment and the second embodiment are applied.

Referring to FIG. 6, a CMOSFET 400 includes an N channel transistor NMOS and a P channel transistor PMOS. A substrate 301 may include a silicon substrate, a silicon-germanium substrate, or an SOI (silicon on insulator) substrate. The N channel transistor NMOS and the P channel transistor PMOS are isolated by an isolation region 315.

The N channel transistor NMOS includes a gate stack 402N that is formed on the substrate 301. The gate stack 402N is substantially the same as the gate stack 302N shown in FIG. 3. In the gate stack 402N, an interface layer 303N, a high-k dielectric layer 304N, a threshold voltage modulation layer 306N, a gate electrode 308N, a capping layer 309N and a low resistance layer 310N may be stacked in that order. The threshold voltage modulation layer 306N contains a species 307N including lanthanum.

The P channel transistor PMOS includes a gate stack 402P that is formed on the substrate 301. The gate stack 402P is similar to the gate stack 302P shown in FIG. 4. The gate stack 402P further includes a reaction preventing layer 401P, a non-threshold voltage modulation layer 306P, and a non-work function layer 403P. In the gate stack 402P, an interface layer 303P, a high-k dielectric layer 304P, a gate electrode 308P, the reaction preventing layer 401P, the non-threshold voltage modulation layer 306P, the non-work function layer 403P, a capping layer 309P and a low resistance layer 310P may be stacked in that order. The gage electrode 308P contains a species 307P including aluminum.

The non-threshold voltage modulation layer 306P does not exert any influence on threshold voltage modulation. The non-threshold voltage modulation layer 306P is the same material as the threshold voltage modulation layer 306N. While the threshold voltage of the P channel transistor PMOS is likely to be shifted by the non-threshold voltage modulation layer 306P, the threshold voltage is not changed due to the presence of the reaction preventing layer 401P. In other words, the reaction preventing layer 401P prevents inter-mixing of the gate electrode 308P and the non-threshold voltage modulation layer 306P.

The non-work function layer 403P does not exert any influence on the change of the effective work function of the gate stack 402P. Namely, the effective work function of the gate stack 402P is dominantly modulated by the gate electrode 308P. The non-work function layer 403P is the same material as the gate electrode 308N. While the effective work function of the gate electrode 308P is likely to be decreased by the non-work function layer 403P, the change of the effective work function is blocked by the reaction preventing layer 401P. That is to say, the reaction preventing layer 401P prevents inter-mixing of the gate electrode 308P and the non-work function layer 403P.

For example, the reaction preventing layer 401P prevents the reaction between the gate electrode 308P and the non-work function layer 403P. Also, the reaction preventing layer 401P prevents lanthanum from diffusing from the non-threshold voltage modulation layer 306P.

According to FIG. 6, in the CMOSFET 400, the threshold voltage of the N channel transistor NMOS is modulated by the dipole-interface 313N and the gate electrode 308N. The threshold voltage of the P channel transistor PMOS is modulated by the dipole-interface 313P, the gate electrode 308P and the germanium-containing channel region 314P. Further, in the P channel transistor PMOS, the change of the effective work function of the gate stack 402P is blocked by the reaction preventing layer 401P.

Figure 7:
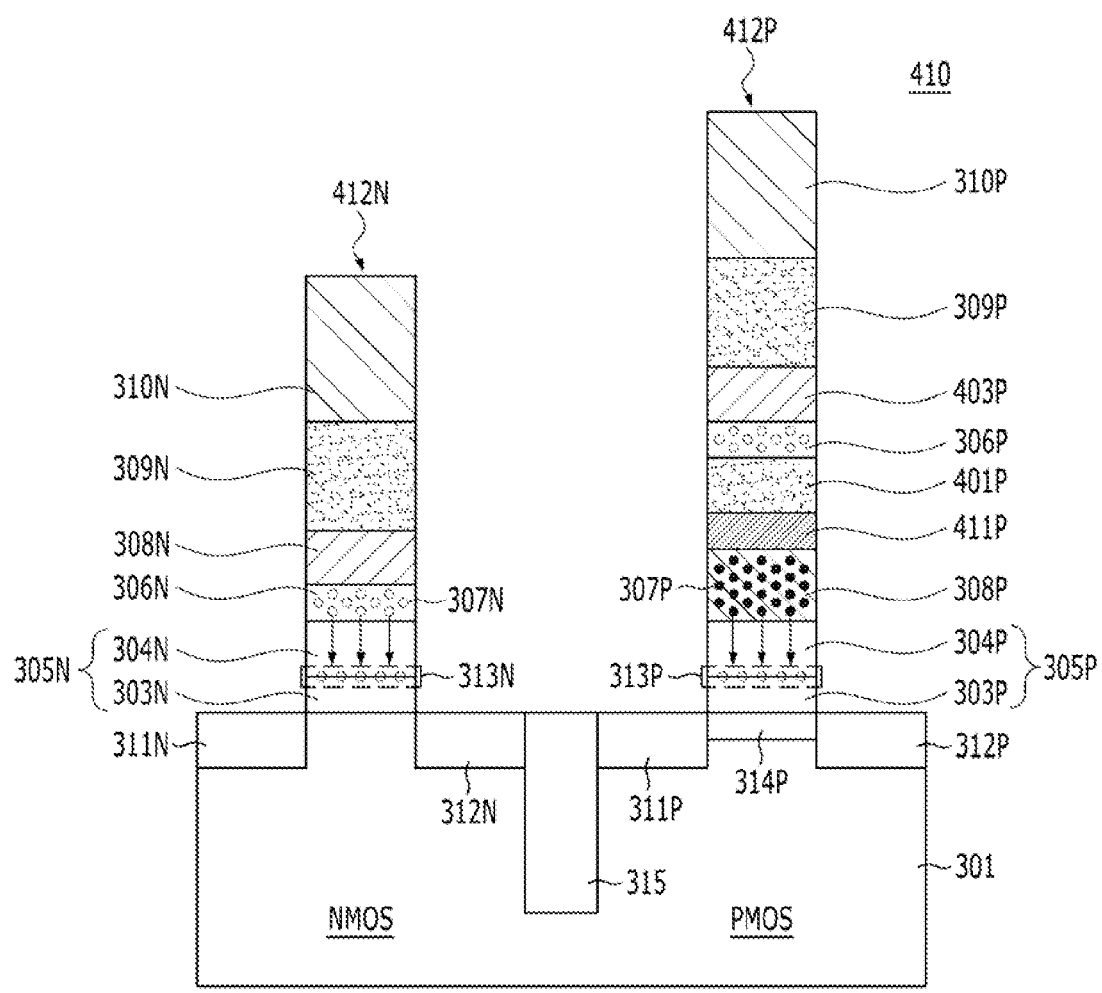
FIG. 7 is a view illustrating still another exemplary CMOSFET to which the first embodiment and the second embodiment are applied.

FIG. 7 is a view illustrating still another exemplary CMOSFET to which the first embodiment and the second embodiment are applied.

A CMOSFET 410 shown in FIG. 7 is similar to the CMOSFET 400 shown in FIG. 6.

An N channel transistor NMOS includes a gate stack 412N that is formed on a substrate 301. The gate stack 412N is the same as the gate stack 402N shown in FIG. 6.

A P channel transistor PMOS includes a gate stack 412P that is formed on the substrate 301. The gate stack 412P is similar to the gate stack 402P shown in FIG. 6. The gate stack 412P of the P channel transistor PMOS further includes a low resistance gate electrode 411P. The low resistance gate electrode 411P is formed between a reaction preventing layer 401P and a gate electrode 308P. By including the low resistance gate electrode 411P, a resistance increase due to the use of TiAlN as the gate electrode 308P is suppressed. The low resistance gate electrode 411P may include a titanium nitride (TIN).

According to FIGS. 5 to 7, in an integration process of a CMOS device, the threshold voltages of an N channel transistor and a P channel transistor may be independently modulated. It may be possible to form an HKMG (high-k metal gate) CMOSFET that suppresses the change of an effective work function and has high thermal stability, and it may also be possible to modulate the threshold voltage of the CMOSFET. By this fact, it may be thus possible to realize a CMOSFET with high performance.

Figure 8A:
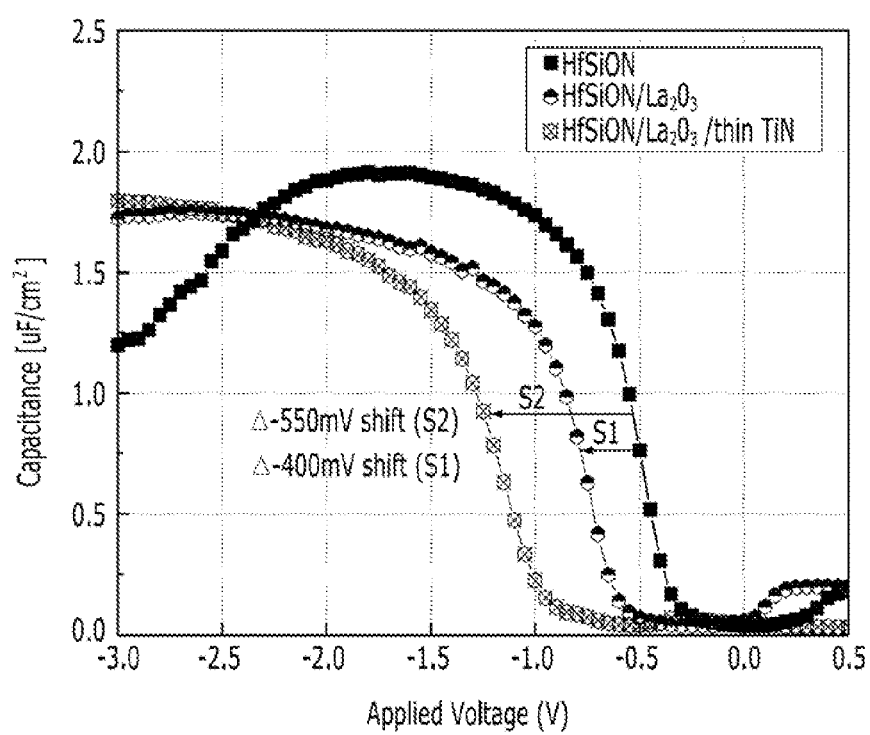
FIG. 8A is a graph showing the C-V characteristic of an N channel transistor according to the embodiments.

FIG. 8A is a graph showing the C-V characteristic of an N channel transistor according to the embodiments. In FIG. 8A, the gate stack of an N channel, transistor has the structure of HfSiON/La$_2$O$_3$/thin TiN. HfSiON is a high-k dielectric layer, La$_2$O$_3$ is a threshold voltage modulation layer, and thin TiN is a gate electrode. A comparative example 1 represents the case of solely using HfSiON, and a comparative example 2 represents the case of stacking HfSiON and La$_2$O$_3$.

Referring to FIG. 8A, in the structure of HfSiON/La$_2$O$_3$/thin TiN, a flat band voltage (Vfb) is shifted in a negative direction when compared to the Vfbs of the comparative example 1 and the comparative example 2. For example, a Vfb of the structure of HfSiON/La$_2$O$_3$/thin TiN is shifted by approximately −550 mV when compared to that of the comparative example 1 (see S2). A Vfb of the comparative example 2 is shifted by approximately −400 mV when compared to that of the comparative example 1 (see S1).

As can be readily seen from FIG. 8A, by applying a lanthanum oxide as a threshold voltage modulation layer, it may be possible to shift the threshold voltage of an N channel transistor in a negative direction. Moreover, by additionally forming a thin thickness titanium nitride (Thin TiN) on the lanthanum oxide, it may be possible to further shift the threshold voltage.

Figure 8B:
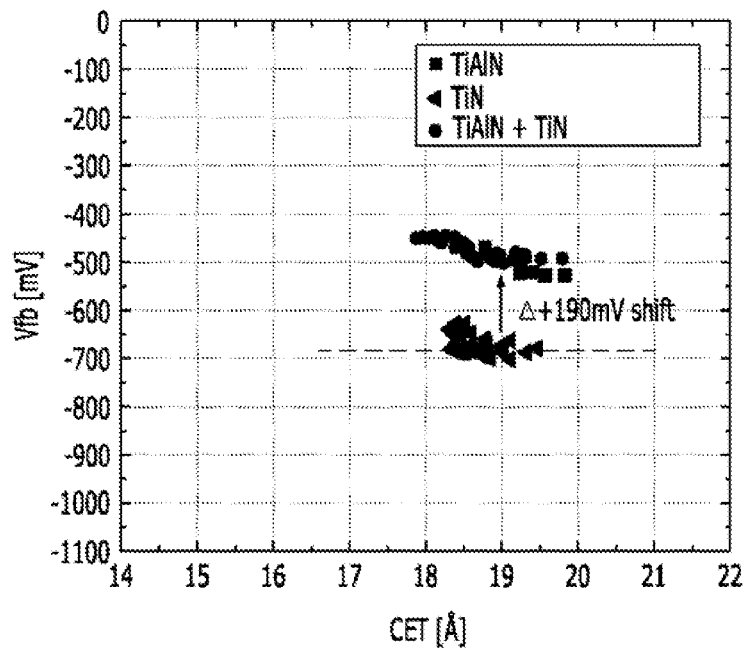
FIG. 8B is a flat band voltage-CET plot of a P channel transistor according to the embodiments.
Figure 8C:
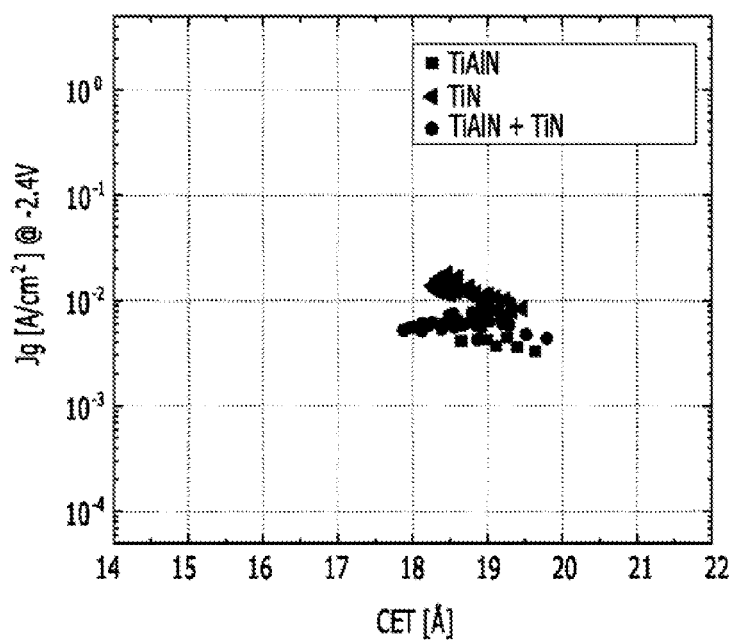
FIG. 8C is a leakage current-CET plot of a P channel transistor according to the embodiments.

FIGS. 8B and 8C show improved characteristics of a P channel transistor according to the embodiments. FIG. 8B is a flat band voltage-CET (capacitance equivalent oxide thickness) plot of a P channel transistor. FIG. 8C is a leakage current-CET plot of a P channel transistor. FIGS. 8B and 8C compare present examples TiAlN and TiAlN/TiN with a comparative example 3, i.e., TiN.

As shown in FIG. 8B, as TiAlN or TiAlN/TiN is applied as a gate electrode, a Vfb is shifted in a positive direction when compared to that of the comparative example 3. For example, approximately +190 mV is shifted.

Referring to FIG. 8C, it may be seen that, when applying TiAlN or TiAlN/TiN, a CET characteristic may be improved when compared to that of the case of solely applying TIN and a leakage current density may be decreased when compared to that of the case of solely applying TIN.

Figure 9:
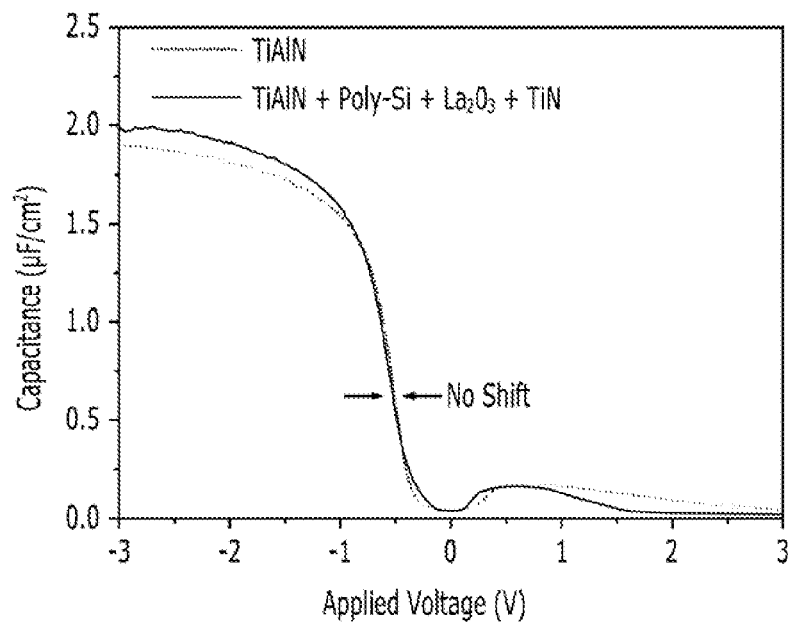
FIG. 9 is a graph comparing C-V characteristics according to a change in the gate stack of a P channel transistor according to the embodiments.

FIG. 9 is a graph comparing C-V characteristics according to a change in the gate stack of a P channel transistor according to the embodiments. FIG. 9 compares the case of applying TiAlN with the case of applying TiAlN/Poly-si/$La_2O_3$/TiN.

Referring to FIG. 9, by forming a polysilicon layer as a reaction preventing layer, between TiAlN and $La_2O_3$/TiN, it may be possible to suppress the negative directionality of a flat band voltage by $La_2O_3$/TiN.

As can be readily seen from FIG. 9, in both cases of applying TiAlN and applying TiAlN/Poly-si/$La_2O_3$/TIN, a P channel transistor exhibits a satisfactory C-V characteristic.

FIGS. 10A to 10H are views explaining a method for fabricating the CMOSFET shown in FIG. 6.

Figure 10A:
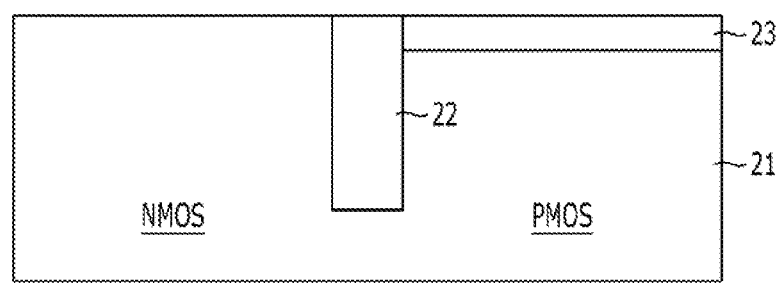
FIGS. 10A to 10H are views explaining a method for fabricating the CMOSFET shown in FIG. 6.

As shown in FIG. 10A, a substrate 21 is prepared. The substrate 21 may include a plurality of regions where transistors are to be formed. The regions may include a first region PMOS and a second region NMOS. The substrate 21 may include a semiconductor substrate. The substrate 21 may include a silicon substrate, a silicon-germanium substrate, or an SOI substrate.

An isolation region 22 is formed in the substrate 21. The isolation region 22 may be formed through an STI (shallow trench isolation) process. For instance, after forming a pad layer (not shown) on the substrate 21, the pad layer and the substrate 21 are etched using an isolation mask (not shown). By this fact, a trench is defined. After defining the trench, by gap-filling a dielectric material in the trench, the isolation layer 22 is formed. As the isolation layer 22, a wall oxide layer, a liner layer and a gap-fill dielectric layer may be sequentially formed. The liner layer may be formed by stacking a silicon nitride layer and a silicon oxide layer. The silicon nitride layer may include $Si_3N_4$, and the silicon oxide layer may include $SiO_2$. The gapfill dielectric layer may include a spin-on dielectric (SOD). In another embodiment, the isolation layer 22 may include a silicon nitride layer as the gapfill dielectric layer.

An epitaxial layer 23 including germanium is selectively formed on the first region PMOS of the substrate 21. As the epitaxial layer 23, a silicon-germanium epitaxial layer and a silicon epitaxial layer are sequentially formed. In the epitaxial layer 23, the concentration of germanium is controlled to approximately 40% or under. Each of the silicon-germanium epitaxial layer and the silicon epitaxial layer is formed to a thickness of approximately 100 Å or under.

Figure 10B:
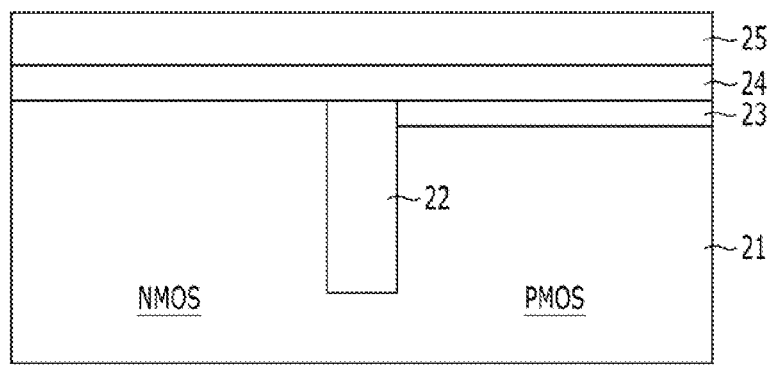

As shown in FIG. 10B, an interface layer 24 is formed. A high-k dielectric layer 25 is formed on the interface layer 24. Before forming the interface layer 24, a cleaning process may be performed. The cleaning process uses a solution that includes a fluoric acid (HF). By performing the cleaning process in this way, a native oxide on the surface of the substrate 21 may be removed, and dangling bonds on the surface of the substrate 21 are passivated by hydrogen to suppress the native oxide from growing before performing a subsequent process.

The interface layer 24 may include silicon oxide, silicon oxynitride, or the like. For example, the interface layer 24 may include $SiO_2$ or SiON. The silicon oxide as the interface layer 24 may be formed using thermal oxidation or may be grown in a wet type using ozone. In particular, when the silicon oxide as the interface layer 24 is grown in a wet type using ozone and the high-k dielectric layer 25 is a silicate material which contains hafnium, hafnium silicate (HfSiO) with an Hf-rich property due to presence of a large amount of hafnium may be formed when forming the high-k dielectric layer 25. By this fact, an effect that the dielectric constant of the high-k dielectric layer 25 is increased may be accomplished. The interface layer 24 is formed to a thickness of approximately 5 Å to approximately 13 Å. The high-k dielectric layer 25 includes a high-k material with a high dielectric constant.

The high-k dielectric layer 25 may be formed using the same material over the first region PMOS and the second region NMOS. The material of the high-k dielectric layer 25 has a dielectric constant larger than the dielectric constant (approximately 3.9) of $SiO_2$ that is generally used as a gate dielectric layer. Further, the high-k dielectric layer 25 is substantially thicker than a layer having $SiO_2$, and has an equivalent oxide thickness (EOT) value smaller than that of a layer having $SiO_2$. Thus, the high-k dielectric layer 25 may have a dielectric constant larger than that of the interface layer 24 having, e.g., $SiO_2$.

The high-k dielectric layer 25 may include a metal oxide, a metal silicate, a metal silicate nitride, or the like. The metal oxide includes an oxide containing a metal such as hafnium (Hf), aluminum (Al), lanthanum (La) and zirconium (Zr). The metal oxide may include hafnium oxide, aluminum oxide, lanthanum oxide, zirconium oxide, or a combination thereof. For example, the metal oxide may include $HfO_2$, $Al_2O_3$, $La_2O_3$, $ZrO_2$, or a combination thereof. The metal silicate includes a silicate that includes a metal such as hafnium (Hf) and zirconium (Zr). For example, the metal silicate may include hafnium silicate (HfSiO), zirconium silicate (ZrSiO) or a combination thereof. The metal silicate nitride includes silicate nitride that includes a metal such as hafnium (Hf) and zirconium (Zr). The metal silicate nitride may include hafnium silicate nitride (HfSiON), zirconium silicate nitride (ZrSiON), or a combination thereof.

By simultaneously forming the high-k dielectric layer 25 over the first region PMOS and the second region NMOS, processing may be simplified. Meanwhile, the high-k dielectric layer 25 may be formed using different materials over the first region PMOS and the second region NMOS. A process for forming the high-k dielectric layer 25 may include a deposition technology that is appropriate for a material to be deposited. For example, chemical vapor deposition (CVD), low-pressure CVD (LPCVD), plasma-enhanced CVD (PECVD), metal-organic CVD (MOCVD), atomic layer deposition (ALD), plasma enhanced ALD (PEALD), and so forth may be used. For uniformly forming a layer, atomic layer deposition (ALD) or plasma enhanced ALD (PEALD) may be used. The high-k dielectric layer 25 may be formed to a thickness of approximately 15 Å to approximately 60 Å.

Hereinbelow, in the embodiment, the high-k dielectric layer 25 may use a metal silicate nitride. In order to form a metal silicate nitride as the high-k dielectric layer 25, after first forming a metal silicate, a nitridation process and an annealing process may be sequentially performed. The nitridation process includes a plasma nitridation process. Accordingly, nitrogen is implanted into the high-k dielectric layer 25. For example, in the case where the high-k dielectric layer 25 is a hafnium silicate nitride layer, after forming a hafnium silicate (HfSiO) layer, a hafnium silicate nitride (HfSiON) layer may be formed by a nitridation process. In this way, by implanting nitrogen into a metal silicate, a dielectric constant is increased, and the crystallization of the metal silicate may be suppressed in a subsequent thermal process. The plasma nitridation process may be performed at a temperature of approximately 400° C. to approximately 600° C. In the plasma nitridation process, a mixed gas of argon (Ar) gas and nitrogen (N₂) gas may be used as a reaction gas. As a metal silicate is exposed on nitrogen plasma in such a plasma nitridation process, the metal silicate becomes a metal silicate nitride. As a nitrogen source for nitrogen plasma, other gases may be used instead of nitrogen (N₂) gas. For example, the nitrogen source may include ammonia (NH₃), hydrazine (N₂H₄), or the like. After the nitridation process, exposure to an annealing process is implemented. Since the annealing process is performed after the nitridation process, the annealing process is referred to as post nitridation anneal. The metal silicate is in a nitrogen-rich state on the surface thereof through the plasma nitridation. By performing the annealing process, the nitrogen atoms implanted into the metal silicate may be uniformly diffused to the inside of the metal silicate. The annealing process may be performed at a temperature of approximately 500° C. to approximately 900° C. under a nitrogen (N₂) gas atmosphere.

By the series of the metal silicate forming process the nitridation process and the annealing process as described above, a metal silicate nitride may be formed as the high-k dielectric layer 25. By forming the high-k dielectric layer 25 using the metal silicate nitride, a dielectric constant may be increased, and crystallization may be suppressed in a subsequent thermal process. The high-k dielectric layer 25 may become a gate dielectric layer.

Figure 10C:
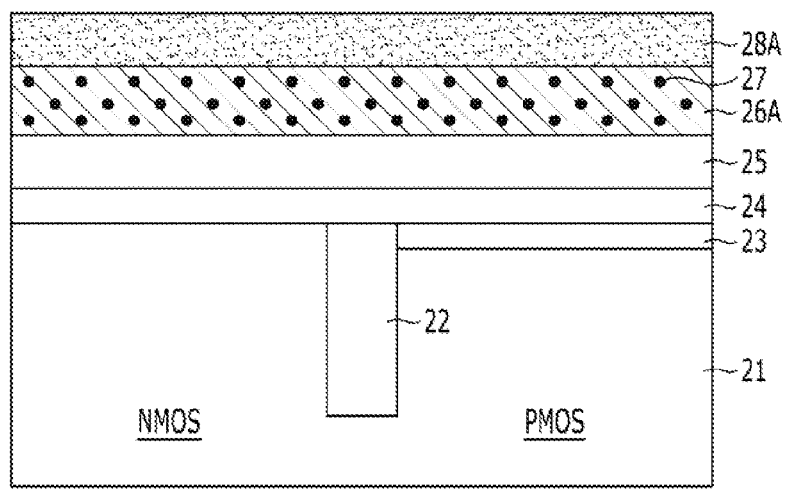

As shown in FIG. 10C, a first metal-containing layer 26A is formed on the high-k dielectric layer 25. The first metal-containing layer 26A may be formed on the entire surface of the substrate 21 including the high-k dielectric layer 25. The first metal-containing layer 26A may become a P type work function metal-containing layer. The P type work function metal-containing layer may include a material of which effective work function is approximately 4.7 eV to approximately 5.2 eV. The first metal-containing layer 26A may contain aluminum 27 for threshold voltage modulation. The aluminum 27 contained in the first metal-containing layer 26A functions to modulate the threshold voltage of a P channel transistor.

The first metal-containing layer 26A may include a metal nitride layer that is doped with the aluminum 27. The metal nitride layer may include titanium nitride. Accordingly, the first metal-containing layer 26A may include a titanium nitride layer that is doped with aluminum. The first metal-containing layer 26A may include titanium-aluminum nitride (TiAlN). The aluminum 27 diffuses to the interface of the interface layer 24 and the high-k dielectric layer 25 by a subsequent thermal process, and forms a first dipole-interface.

A reaction preventing layer 28A is formed on the first metal-containing layer 26A. The reaction preventing layer 28A passivates the first metal-containing layer 26A from a subsequent process. The reaction preventing layer 28A includes a silicon-containing layer. The reaction preventing layer 28A may include a polysilicon layer. In another embodiment, a low resistance gate electrode may be formed on the reaction preventing layer 28A (see FIG. 7).

Figure 10D:
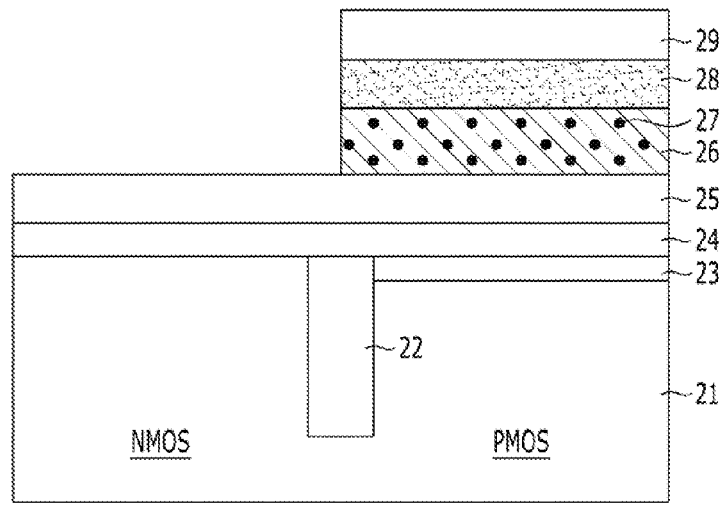

As shown in FIG. 10D, a mask pattern 29 is formed. The reaction preventing layer 28A and the first metal-containing layer 26A are removed over the second region NMOS by using the mask pattern 29 as an etch barrier. According to this fact, the first metal-containing layer 26A remains over the first region PMOS as designated by the reference numeral 26. Also, the portion of the reaction preventing layer 28A, which remains over the first region PMOS, is designated by the reference numeral 28. As both the first metal-containing layer 26A and the reaction preventing layer 28A are removed over the second region NMOS, the high-k dielectric layer 25 is exposed.

Figure 10E:
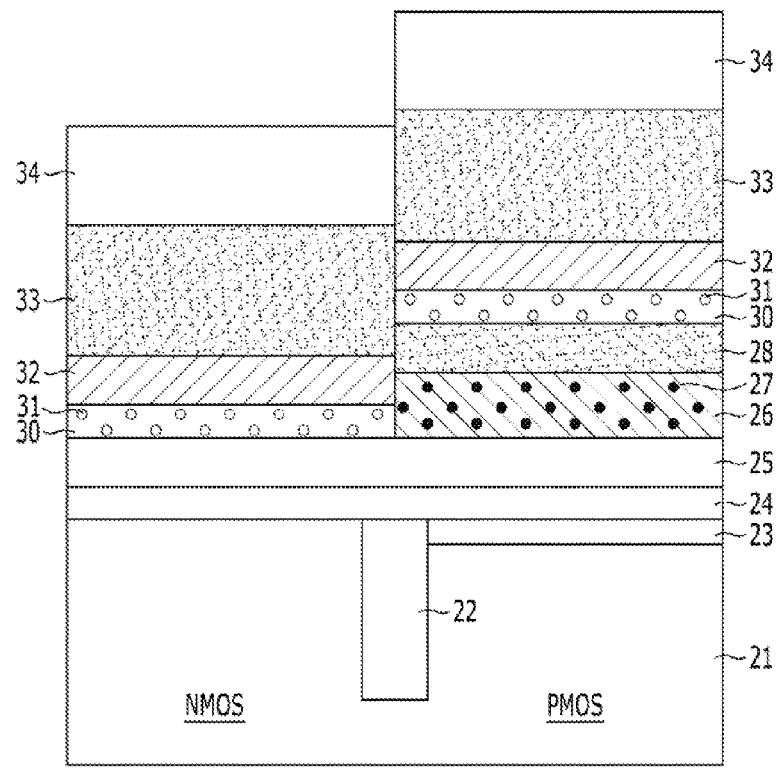

As shown in FIG. 10E, after removing the mask pattern 29, a threshold voltage modulation layer 30 is formed on the entire surface of the substrate 21. The threshold voltage modulation layer 30 may contain lanthanum 31 for threshold voltage modulation. The threshold voltage modulation layer 30 may include lanthanum oxide. The threshold voltage modulation layer 30 is formed over both the first region PMOS and the second region NMOS.

A second metal-containing layer 32 is formed on the threshold voltage modulation layer 30. The second metal-containing layer 32 has a work function appropriate for an N channel transistor. Accordingly, the second metal-containing layer 32 may be an N type work function metal-containing layer. The N type work function metal-containing layer may include a material of which work function is approximately 4.1 eV to approximately 4.5 eV. The second metal-containing layer 32 may be controlled in its thickness to have an N type work function. The second metal-containing layer 32 is formed to a thickness of approximately 30 Å or under. The second metal-containing layer 32 may include a metal nitride. The second metal-containing layer 32 may include titanium nitride. The second metal-containing layer 32 may be formed as a stoichiometric titanium nitride. The stoichiometric titanium nitride has the stoichiometric composition ratio of 1:1 between titanium and nitrogen. The titanium nitride may be formed using physical vapor deposition (PVD). According to this fact, it may be possible to control the composition ratio of titanium and nitrogen in the titanium nitride.

When forming the second metal-containing layer 32, reaction between the first metal-containing layer 26 and the second metal-containing layer 32 over the first region PMOS is prevented by the reaction preventing layer 28. That is to say, inter-mixing between the first metal containing layer 26 and the second metal-containing layer 32 does not occur. Through this, since a process for removing the second metal-containing layer 32 over the first region PMOS may be omitted, processing may be simplified. Meanwhile, in the case where the reaction preventing layer 28 does not exist, as the second metal-containing layer 32 and the first metal-containing layer 26 react with each other, the work function of the first metal-containing layer 26 decreases. Therefore, in the present embodiment, by forming the reaction preventing layer 28 on the first metal-containing layer 26, it may be possible to prevent the work function of the first metal-containing layer 26 from being decreased by the second metal-containing layer 32. Further, the reaction preventing layer 28 prevents reaction between the threshold voltage modulation layer 30 and the first metal-containing layer 26.

A capping layer 33 is formed on the second metal-containing layer 32. The capping layer 33 may include a polysilicon layer.

A third metal-containing layer 34 is formed on the capping layer 33. The third metal-containing layer 34 may reduce the resistance of a gate stack. The third metal-containing layer 34 may include nickel (Ni) or nickel-platinum (NiPt).

Figure 10F:
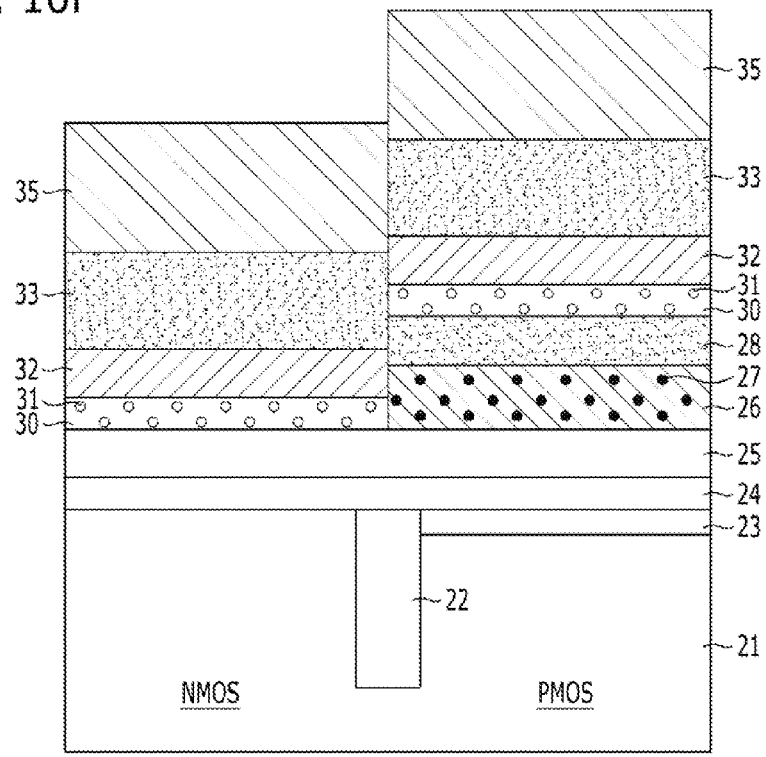

As shown in FIG. 10F, a high temperature thermal process is performed. A fourth metal-containing layer 35 is formed by the high temperature thermal process. The fourth metal-containing layer 35 is formed by the reaction of the capping layer 33 and the third metal-containing layer 34. In particular, the fourth metal-containing layer 35 is formed by full silicidation of the third metal-containing layer 34. The top portion of the capping layer 33 is consumed for full silicidation of the third metal-containing layer 34. The fourth metal-containing layer 35 may include nickel-platinum silicide (NiPtSi).

By the series of processes as described above, a first stack layer and a second stack layer are formed. The first stack layer as the stack structure formed over the first region PMOS includes the interface layer 24, the high-k dielectric layer 25, the first metal-containing layer 26, the reaction preventing layer 28, the threshold voltage modulation layer 30, the second metal-containing layer 32, the capping layer 33, and the fourth metal-containing layer 35. The second stack layer as the stack structure formed over the second region NMOS includes the interface layer 24, the high-k dielectric layer 25, the threshold voltage modulation layer 30, the second metal-containing layer 32, the capping layer 33, and the fourth metal-containing layer 35.

Figure 10G:
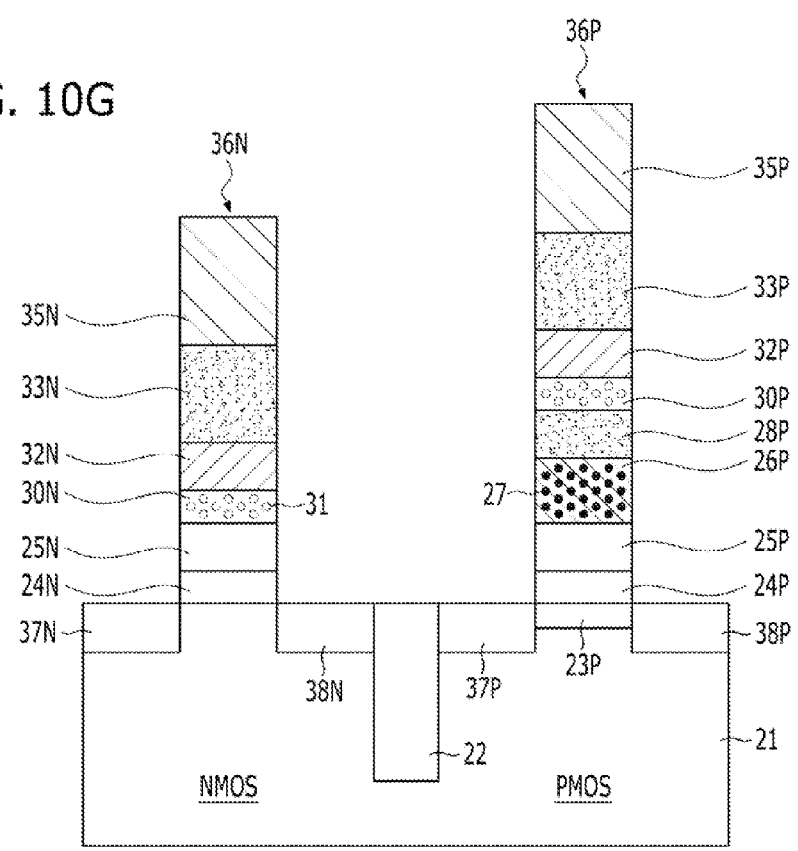

As shown in FIG. 10G, the first stack layer and the second stack layer are etched using a gate mask (not shown). For example, the fourth metal-containing layer 35, the capping layer 33, the second metal-containing layer 32, the threshold voltage modulation layer 30, the reaction preventing layer 28, the first metal-containing layer 26, the high-k dielectric layer 25, and the interface layer 24 are sequentially etched. According to this fact, a first gate stack 36P is formed over the first region PMOS.

Further, the fourth metal-containing layer 35, the capping layer 33, the second metal-containing layer 32, the threshold voltage modulation layer 30, the high-k dielectric layer 25, and the interface layer 24 are sequentially etched. According to this fact, a second gate stack 36N is formed over the second region NMOS.

The first gate stack 36P and the second gate stack 36N may be formed through simultaneous patterning by using one gate mask.

In the first gate stack 36P, a first interface layer 24P, a first high-k dielectric layer 25P, a first gate electrode 26P, a reaction preventing layer 28P, a non-threshold voltage modulation layer 30P, a non-work function layer 32P, a first capping layer 33P, and a first low resistance layer 35P may be stacked in that order. The first gate electrode 26P is formed by etching the first metal-containing layer 26. The reaction preventing layer 28P is formed by etching the reaction preventing layer 28. The non-threshold voltage modulation layer 30P is formed by etching the threshold voltage modulation layer 30. The non-work function layer 32P is formed by etching the second metal-containing layer 32. The first capping layer 33P is formed by etching the capping layer 33. The first low resistance layer 35P is formed by etching the fourth metal-containing layer 35. The first gate electrode 26P includes the aluminum 27.

The non-work function layer 32P does not exert any influence on a change in the effective work function of the first gate stack 36P. In other words, the effective work function of the first gate stack 36P is dominantly modulated by the first gate electrode 26P.

The non-threshold voltage modulation layer 30P does not exert any influence on threshold voltage modulation.

In the second gate stack 36N, a second interface layer 24N, a second high-k dielectric layer 25N, a threshold voltage modulation layer 30N, a second gate electrode 32N, a second capping layer 33N, and a second low resistance layer 35N may be stacked in that order. The second gate electrode 32N is formed by etching the second metal-containing layer 32. The second capping layer 33N is formed by etching the capping layer 33. The second low resistance layer 35N is formed by etching the fourth metal-containing layer 35. The threshold voltage modulation layer 30N is formed by etching the threshold voltage modulation layer 30. The threshold voltage modulation layer 30N includes the lanthanum 31.

The first interface layer 24P and the second interface layer 24N are formed by etching the interface layer 24. The first high-k dielectric layer 25P and the second high-k dielectric layer 25N are formed by etching the high-k dielectric layer 25.

In this way, the semiconductor device includes the first gate stack 36P and the second gate stack 36N, which have different threshold voltage modulation species. The first gate stack 36P includes the aluminum 27. The second gate stack 36N includes the lanthanum 31.

Following the gate patterning process, processes generally known in the art may be performed. For example, processes for forming sources/drains may be performed. The sources/drains include first sources/drains 37P/38P and second sources/drains 37N/38N. The first sources/drains 37P/38P are formed in the first region PMOS. The second sources/drains 37N/38N are formed in the second region NMOS. The first sources/drains 37P/38P include P type dopants, and the second sources/drains 37N/38N include N type dopants. A germanium-containing channel region 23P is formed between the first source 37P and the first drain 38P under the first gate stack 36P.

By forming the first sources/drains 37P/38P and the second sources/drains 37N/38N in this way, a first transistor and a second transistor are formed. The first transistor includes the first gate stack 36P and the first sources/drains 37P/38P. The second transistor includes the second gate stack 36N and the second sources/drains 37N/38N. The first transistor may include a P channel transistor that includes a PMOSFET. The second transistor may include an N channel transistor that includes an NMOSFET. Accordingly, a CMOSFET that includes the N channel transistor and the P channel transistor is formed on the substrate 21.

Figure 10H:
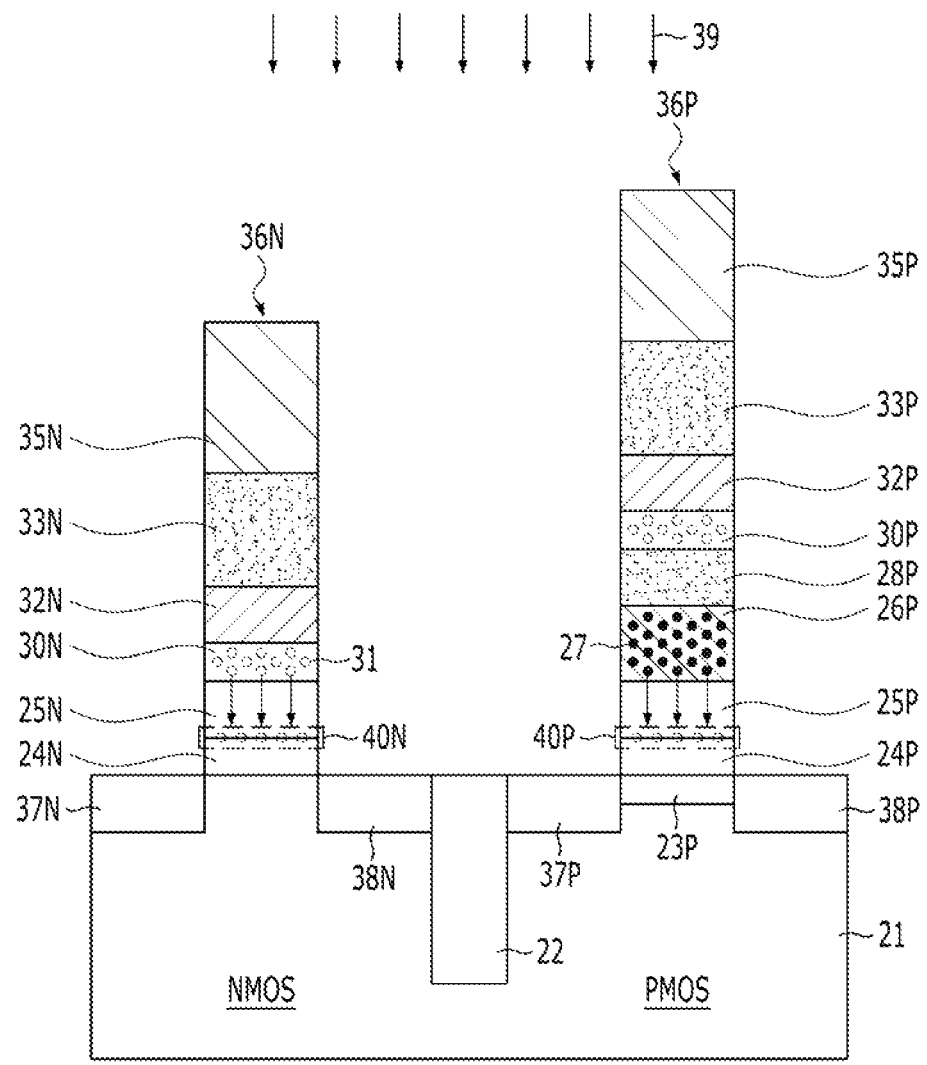

As shown in FIG. 10H, first and second dipole-interfaces 40P and 40N are formed.

The first dipole-interface 40P is formed in a first gate dielectric layer that includes the first interface layer 24P and the first high-k dielectric layer 25P. The first dipole-interface 40P is formed on the interface of the first interface layer 24P and the first high-k dielectric layer 25P. The first dipole-interface 40P is formed by diffusion of the aluminum 27.

The second dipole-interface 40N is formed in a second gate dielectric layer that includes the second interface layer 24N and the second high-k dielectric layer 25N. The second dipole-interface 40N is formed on the interface of the second interface layer 24N and the second high-k dielectric layer 25N. The second dipole-interface 40N is formed by diffusion of the lanthanum 31.

An annealing process 39 is performed to form the first and second dipole-interfaces 40P and 40N. The annealing process 39 includes annealing for activating the first sources/drains 37P/38P and the second sources/drains 37N/38N. In another embodiment, the annealing process 39 for forming the first and second dipole-interfaces 40P and 40N may include high temperature annealing for forming the fourth metal-containing layer 35 shown in FIG. 10F.

According to the present embodiment as the first, gate stack 36P includes the first gate electrode 26P that includes the aluminum 27, the threshold voltage of the first transistor may be modulated. For example, when the first transistor includes a P channel transistor, the threshold voltage of the P channel transistor may be decreased.

As the second gate stack 36N includes the threshold voltage modulation layer 30N and the second gate electrode 32N that has a thin thickness, the threshold voltage of the second transistor may be modulated. For example, in the case where the second transistor includes an N channel transistor, the threshold voltage of the N channel transistor may be decreased.

As a result, in the present embodiment, in the integration process of the CMOSFET, the threshold voltages of the N channel transistor and the P channel transistor may be independently modulated.

Furthermore, even when a CMOSFET process is performed by a gate-first process, since a gate stack with high thermal stability is formed, a threshold voltage is not increased by a subsequent thermal process.

The NMOSFET, the PMOSFET and the CMOSFET according to the embodiments may be integrated in an integrated circuit.

The NMOSFET, the PMOSFET and the CMOSFET according to the embodiments may be applied to transistor circuits including transistors for various purposes. For example, the NMOSFET, the PMOSFET and the CMOSFET according to the embodiments may be applied to transistor circuits including an IGFET (insulated, gate FET), an HEMT (high electron mobility transistor), a power transistor, a TFT (thin film transistor), and so forth.

The NMOSFET, the PMOSFET and the CMOSFET and the integrated circuit according to the embodiments may be built in an electronic device. The electronic device may include a memory and a non-memory. The memory includes an SRAM, a DRAM, a FLASH, an MRAM, an ReRAM, an STTRAM, an FeRAM and the like. The non-memory includes a logic circuit. The logic circuit may include a sense amplifier, a decoder, an input/output circuit and so forth, for controlling a memory device. Also, the logic circuit may include various ICs other than a memory. For example, the logic circuit includes a microprocessor, a mobile device, an application processor, and so forth. Further, the non-memory includes a logic gate such as a NAND gate, a driver IC for a display device, a power semiconductor device such as a power management IC (PMIC), and so forth. The electronic device may include a computing system, an image sensor, a camera, a mobile device, a display device, a sensor, a medical instrument, an optoelectronic device, an RFID (radio frequency identification), a photovoltaic cell, a semiconductor device for an automobile, a semiconductor device for a railroad car, a semiconductor device for an aircraft, and so forth.

Hereafter, various application examples including the transistor according to the embodiments will be described.

FIGS. 11A to 11D are diagrams showing various application examples of an integrated circuit including transistors according to the embodiments.

Figure 11A:
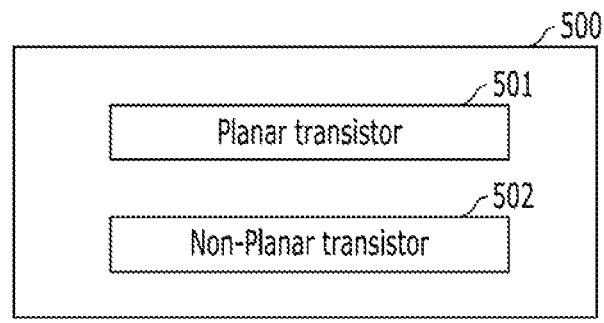
FIGS. 11A to 11D are diagrams showing various application examples of an integrated circuit including transistors according to the embodiments.

An integrated circuit 500 shown in FIG. 11A includes a plurality of planar transistors 501 and a plurality of non-planar transistors 502.

Figure 11B:
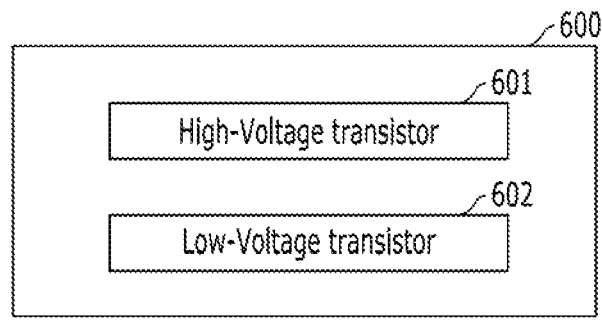

An integrated circuit 600 shown in FIG. 11B includes a plurality of high voltage transistors 601 and a plurality of low voltage transistors 602.

Figure 11C:
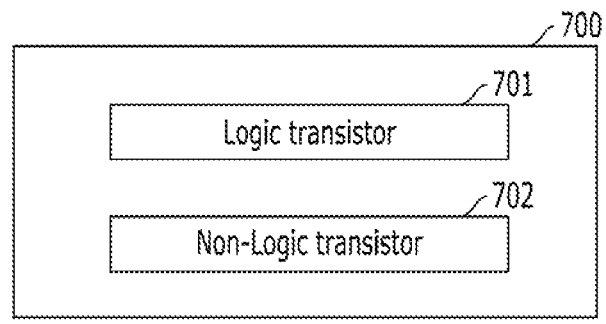

An integrated circuit 700 shown in FIG. 11C includes a plurality of logic transistors 701 and a plurality of non-logic transistors 702.

Figure 11D:
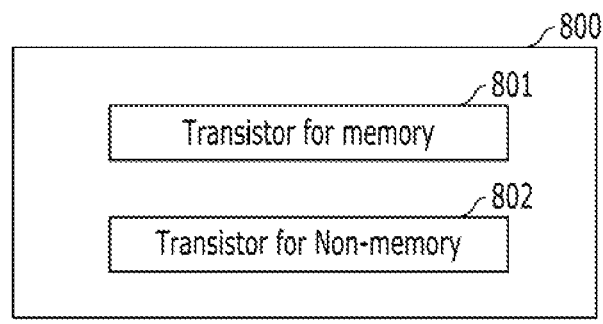

An integrated circuit 800 shown in FIG. 11D includes transistors 801 for a memory device and transistors 802 for a non-memory device.

The above-described planar transistors 501, non-planar transistors 502, high voltage transistors 601, low voltage transistors 602, logic transistors 701, non-logic transistors 702, transistors 801 for a memory device, and transistors 802 for a non-memory device may include transistors according to the embodiments. Therefore, it may be possible to improve the performance of the integrated circuits 500, 600, 700 and 800.

Figure 12:
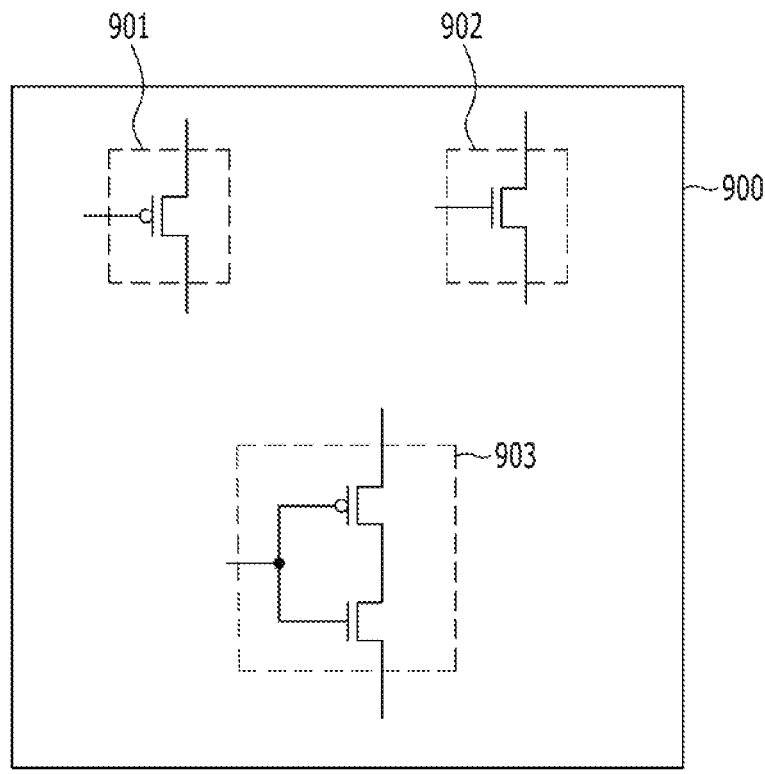
FIG. 12 is a diagram showing an electronic device including transistors according to the embodiments.

FIG. 12 is a diagram showing an electronic device including transistors according to the embodiments.

Referring to FIG. 12, an electronic device 900 may include a plurality of PMOSFETs 901, a plurality of NMOSFETs 902 and a plurality of CMOSFETs 903. The PMOSFETs 901, the NMOSFETs 902 and the CMOSFETs 903 may include PMOSFETs, NMOSFETs and CMOSFETs according to the embodiments, respectively. Therefore, since the electronic device 900 includes the transistors with improved performance, the electronic device 900 may realize a high operation speed in correspondence to scaling-down.

Figure 13:
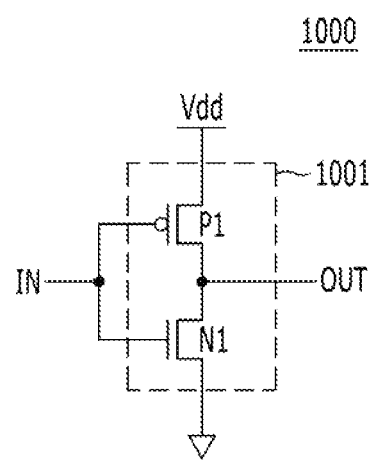
FIG. 13 is a circuit diagram showing an inverter including transistors according to the embodiments.

FIG. 13 is a circuit diagram showing an inverter including transistors according to the embodiments. FIG. 13 shows a CMOS inverter.

Referring to FIG. 13, an inverter 1000 may be formed by a CMOSFET 1001 including a PMOSFET P1 and an NMOSFET N1, which are sequentially coupled from a power supply terminal Vdd. The power supply terminal Vdd may be coupled to the drain of the PMOSFET P1, and a ground terminal may be coupled to the source of the NMOSFET N1. The CMOSFET 1001 may include the CMOSFET according to the embodiments.

Figure 14:
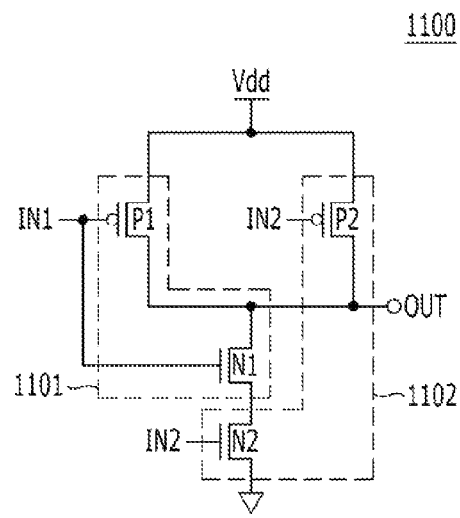
FIG. 14 is a circuit diagram showing a logic gate including transistors according to the embodiments.

FIG. 14 is a circuit diagram showing a logic gate including transistors according to the embodiments. FIG. 14 shows a NAND gate.

Referring to FIG. 14, a NAND gate 1100 includes a first CMOSFET 1101 and a second CMOSFET 1102 to which different input signals IN1 and IN2 are transferred, respectively. The first CMOSFET 1101 includes a first PMOSFET P1 and a first NMOSFET N1 to which the first input signal IN1 is transferred. The second CMOSFET 1102 includes a second PMOSFET P2 and a second NMOSFET N2 to which the second input signal IN2 is transferred. Each of the first CMOSFET 1101 and the second CMOSFET 1102 of the NAND gate 1100 may include the CMOSFET according to the embodiments.

Figure 15:
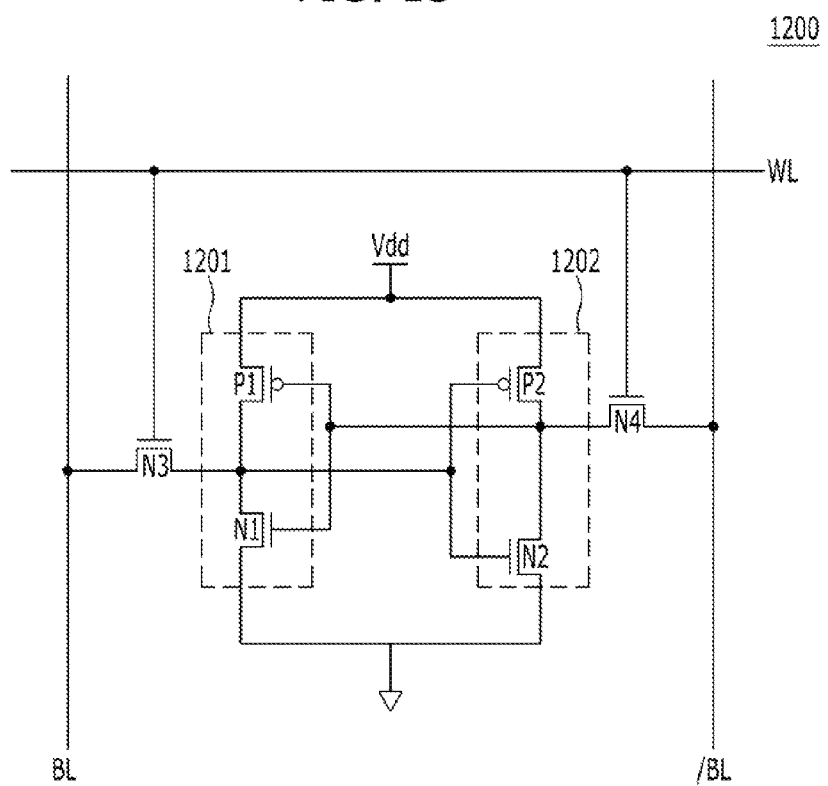
FIG. 15 is a circuit diagram showing a memory cell including transistors according to the embodiments.

FIG. 15 is a circuit diagram showing a memory cell including transistors according to the embodiments. FIG. 15 shows an SRAM cell.

Referring to FIG. 15, an SRAM cell 1200 includes a plurality of transistors. For example, the SRAM cell 1200 includes PMOSFETs P1 and P2 of which sources are coupled to a power supply terminal Vdd. Further, the SRAM cell 1200 includes NMOSFETs N1 and N2 of which sources are grounded. The drains of the PMOSFET P1 and the NMOSFET N1 are coupled with each other, and the drains of the PMOSFET P2 and the NMOSFET N2 are coupled with each other. That is to say, two CMOSFETs 1201 and 1202 are included in the SRAM cell 1200. Moreover, an NMOSFET N3 of which gate is coupled to a word line WL is coupled between the CMOSFET 1201 and a bit line BL. An NMOSFET N4 of which gate is coupled to the word line WL is coupled between the CMOSFET 1202 and a bit line bar /BL. In this way, the CMOSFETs 1201 and 1202 and the NMOSFETs N3 and N4 are included in the SRAM cell 1200.

In FIG. 15, each of the NMOSFETs N1, N2, N3 and N4 and the PMOSFETs P1 and P2 includes the transistor according to the embodiments. Accordingly, the SRAM cell 1200 may operate at a high speed.

Figure 16:
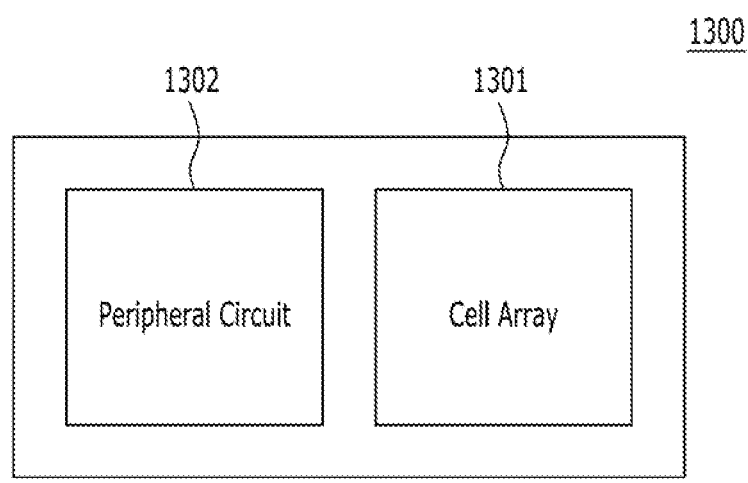
FIG. 16 is a diagram showing a memory device including transistors according to the embodiments.

FIG. 16 is a diagram showing a memory device including transistors according to the embodiments.

Referring to FIG. 16, a memory device 1300 may include a memory cell array 1301 and a peripheral circuit 1302. The memory cell array 1301 may include SRAM cells that include transistors according to the embodiments of the present disclosure. Also, in the case where the memory cell array 1301 is a DRAM, a PRAM, an FeRAM or a flash memory, transistors according to the embodiments may be applied to the peripheral circuit 1302 of the memory cell array 1301. The peripheral circuit 1302 includes a decoder, a sense amplifier, an I/O circuit, and so forth. The peripheral circuit 1302 includes a plurality of transistors. The transistors of the peripheral circuit 1302 may include transistors according to the embodiments. Accordingly, the memory device 1300 including a plurality of transistors of which performance is improved may operate at a high speed and may be scaled down.

Although various embodiments have been described for illustrative purposes, it will be apparent to those skilled in the art that various changes and modifications may be made without departing from the spirit and scope of the invention as defined in the following claims.

What is claimed is:

1. A method for fabricating a semiconductor device, comprising:
    forming an NMOS region and a PMOS region in a substrate;
    forming a gate dielectric layer over the substrate;
    forming a first work function layer that contains aluminum over the gate dielectric layer;
    forming a reaction preventing layer consisting of polysilicon over the first work function layer;
    selectively removing the reaction preventing layer and the first work function layer from the NMOS region;
    forming a threshold voltage modulation layer that contains lanthanum over the remaining reaction preventing layer of the PMOS region and the gate dielectric layer of the NMOS region;
    forming a second work function layer over the threshold voltage modulation layer; and
    annealing, thereby forming a first dipole-interface by diffusion of the aluminum into the gate dielectric layer of the PMOS region and a second dipole-interface by diffusion of the lanthanum into the gate dielectric layer of the NMOS region, respectively,
    wherein the remaining reaction preventing layer is formed between the first work function layer and the threshold voltage modulation layer over the PMOS region.

2. The method according to claim 1, wherein, before the annealing, the method further comprises:
    etching the second work function layer, the threshold voltage modulation layer, the remaining reaction preventing layer, the remaining first work function layer, and the gate dielectric layer over the PMOS region, thereby forming a first gate stack over the PMOS region;
    etching the second work function layer, the threshold voltage modulation layer and the gate dielectric layer over the NMOS region, thereby forming a second gate stack over the NMOS region; and
    implanting impurities into the substrate to form sources/drains,
    wherein the annealing includes annealing for activating the sources/drains.

3. The method according to claim 1, wherein, before the annealing, the method further comprises:
    stacking a capping layer and a metal-containing layer over the second work function layer; and
    silicidating the metal-containing layer,
    wherein the annealing includes annealing for the silicidating.

4. The method according to claim 1, wherein the first work function layer comprises a titanium nitride layer that contains aluminum.

5. The method according to claim 1, wherein the second work function layer is formed to be thinner than the first work function layer.

6. The method according to claim 1, wherein the first work function layer and the second work function layer comprise titanium nitride, and wherein the first work function layer has a P type work function by the aluminum, and the second work function layer is formed thinner than the first work function layer to have an N type work function.

7. The method according to claim 1, wherein the second work function layer comprises titanium nitride that has a stoichiometric composition ratio of approximately 1:1 between titanium and nitrogen.

8. The method according to claim 1, wherein the threshold voltage modulation layer comprises lanthanum oxide.

9. The method according to claim 1, wherein the gate dielectric layer is formed by stacking an interface layer and a high-k dielectric layer, and the first dipole-interface is formed on an interface of the interface layer and the high-k dielectric layer of the PMOS region and the second dipole-interface is formed on an interface of the interface layer and the high-k dielectric layer of the NMOS region.

10. A method for fabricating a semiconductor device, comprising:
    forming a PMOS region and an NMOS region in a substrate;
    forming a gate dielectric layer over the substrate;
    forming a first titanium nitride layer that contains aluminum over the gate dielectric layer;
    forming a polysilicon layer as a reaction preventing layer over the first titanium nitride layer;
    selectively removing the polysilicon layer and the first titanium nitride layer from the NMOS region;
    forming a threshold voltage modulation layer that contains lanthanum over, the remaining polysilicon layer of the PMOS region and the gate dielectric layer of the NMOS region;
    forming a second titanium nitride layer over the threshold voltage modulation layer; and
    annealing a resulting structure on the substrate, thereby diffusing the aluminum into the gate dielectric layer of the PMOS region and the lanthanum into the gate dielectric layer of the NMOS region, respectively,
    wherein the remaining polysilicon layer is formed between the first titanium nitride layer and the threshold voltage modulation layer over the PMOS region.

11. The method according to claim 10, wherein, before the annealing, the method further comprises:
    etching the second titanium nitride layer, the threshold voltage modulation layer, the remaining polysilicon layer, the remaining first titanium nitride layer, and the gate dielectric layer over the PMOS region, thereby forming a first gate stack over the PMOS region;
    etching the second titanium nitride layer, the threshold voltage modulation layer and the gate dielectric layer over the NMOS region, thereby forming a second gate stack over the NMOS region; and
    implanting impurities into the substrate to form sources/drains,
    wherein the annealing includes annealing for activating the sources/drains.

12. The method according to claim 10, wherein, before the annealing, the method further comprises:
    stacking a capping layer and a metal-containing layer over the second titanium nitride layer; and
    silicidating the metal-containing layer, wherein the annealing includes annealing for the silicidating.

13. The method according to claim 10, wherein the second titanium nitride layer is formed to be thinner than the first titanium nitride layer.

14. The method according to claim 10, wherein the first titanium nitride layer has a P type work function by the aluminum, and the second titanium nitride layer is formed thinner than the first titanium nitride to have an N type work function.

15. The method according to claim 10, wherein the second titanium nitride layer comprises titanium nitride that has a stoichiometric composition ratio of approximately 1:1 between titanium and nitrogen.

16. The method according to claim 10, wherein the threshold voltage modulation layer comprises lanthanum oxide.

* * * * *